United States Patent
Nam et al.

(10) Patent No.: US 12,476,073 B2
(45) Date of Patent: Nov. 18, 2025

(54) SCANNING ELECTRON MICROSCOPE IMAGE-BASED PITCH WALK INSPECTION METHOD AND METHOD OF MANUFACTURING SEMICONDUCTOR DEVICE COMPRISING THE INSPECTION METHOD

(71) Applicant: SAMSUNG ELECTRONICS CO., LTD., Suwon-si (KR)

(72) Inventors: Sung Min Nam, Suwon-si (KR); Jaeseung Jeong, Hwaseong-si (KR); Dongho Kim, Hwaseong-si (KR); Seunghune Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 554 days.

(21) Appl. No.: 17/935,128

(22) Filed: Sep. 25, 2022

(65) Prior Publication Data
US 2023/0253179 A1    Aug. 10, 2023

(30) Foreign Application Priority Data
Feb. 9, 2022  (KR) .................. 10-2022-0016974

(51) Int. Cl.
*H01J 37/28* (2006.01)
*G01B 11/02* (2006.01)
(Continued)

(52) U.S. Cl.
CPC .............. *H01J 37/28* (2013.01); *G01B 11/02* (2013.01); *H01J 37/222* (2013.01); *H01L 22/12* (2013.01);
(Continued)

(58) Field of Classification Search
CPC .... H01J 37/28; H01J 37/222; H01J 2237/223; H01J 2237/226; H01J 2237/2817; G01B 11/02; G01B 2210/56; H01L 22/12
See application file for complete search history.

(56) References Cited

U.S. PATENT DOCUMENTS

| | | |
|---|---|---|
| 7,760,296 B2 | 7/2010 | Hitomi et al. |
| 10,107,765 B2 | 10/2018 | Sapiens et al. |

(Continued)

OTHER PUBLICATIONS

Fang Fang, et atl, "SAQP pitch walk metrology using single target metrology," Proceedings of the SPIE, vol. 10145, id., pp. 101452R-1 to 101462R-7 pp. (2017).

(Continued)

*Primary Examiner* — Michael J Logie
*Assistant Examiner* — Hanway Chang
(74) *Attorney, Agent, or Firm* — Morgan, Lewis & Bockius LLP

(57) ABSTRACT

A pitch walk inspection method includes obtaining a scanning electron microscope (SEM) image for a line and space (L/S) pattern formed by a multi-patterning technology (MPT), where L/S pattern includes a plurality of lines and spaces that are alternately arranged; detecting a main pitch of the L/S pattern in the SEM image; dividing a graph of the main pitch into graphs of component pitches, based on the MPT; performing a Fast Fourier Transform (FFT) on each graph of the component pitches; multiplying a phase and an intensity graph of the FFT of each of the graphs of the component pitches with each other and obtaining compensated FFT phase graphs; and calculating a pitch walk for the L/S pattern by obtaining differences between phase peak values of the compensated FFT phase graphs.

20 Claims, 31 Drawing Sheets

(51) Int. Cl.
*H01J 37/22* (2006.01)
*H01L 21/66* (2006.01)

(52) U.S. Cl.
CPC ..... *G01B 2210/56* (2013.01); *H01J 2237/223* (2013.01); *H01J 2237/226* (2013.01); *H01J 2237/2817* (2013.01)

(56) References Cited

U.S. PATENT DOCUMENTS

| | | |
|---|---|---|
| 10,151,986 B2 | 12/2018 | Shchegrov et al. |
| 10,215,559 B2 | 2/2019 | Pandev et al. |
| 10,380,728 B2 | 8/2019 | Fandev |
| 10,612,916 B2 | 4/2020 | Shchegrov et al. |
| 10,712,145 B2 | 7/2020 | Chen et al. |
| 10,727,067 B2 | 7/2020 | Clark et al. |

OTHER PUBLICATIONS

Taher Kagalwala, et al., "Measuring self-aligned quadruple patterning pitch walking with scatterometry-based metrology utilizing virtual reference", J. Micro/Nanolith, MEMS MOEMS 15(4), pp. 044004-1-044004-7, (Oct.-Dec. 2016).

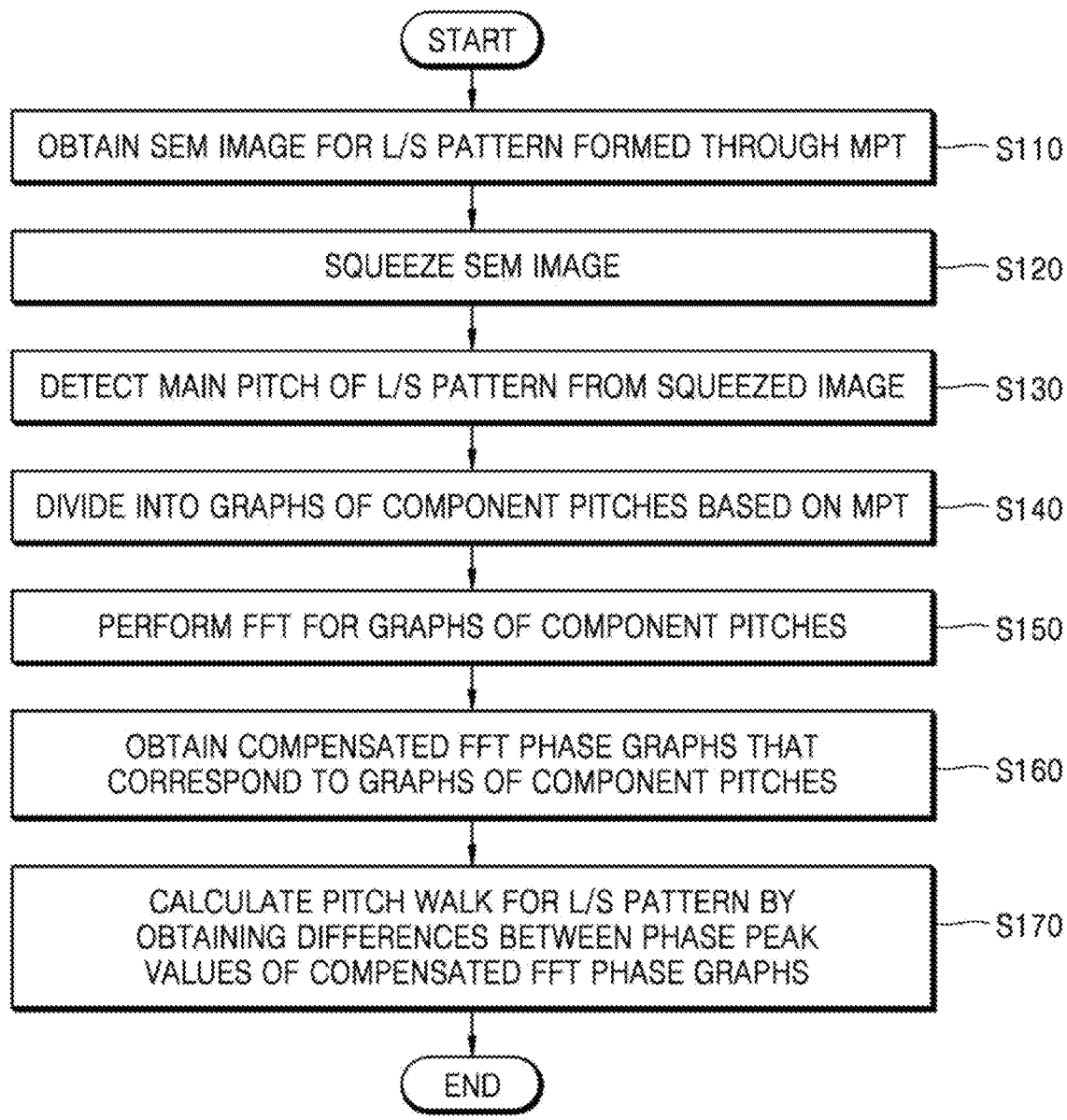

SCANNING ELECTRON MICROSCOPE IMAGE-BASED PITCH WALK INSPECTION METHOD AND METHOD OF MANUFACTURING SEMICONDUCTOR DEVICE COMPRISING THE INSPECTION METHOD

CROSS-REFERENCE TO RELATED APPLICATIONS

This application claims priority under 35 U.S.C. § 119 from Korean Patent Application No. 10-2022-0016974, filed on Feb. 9, 2022 in the Korean Intellectual Property Office, the contents of which are herein incorporated by reference in their entirety.

TECHNICAL FIELD

Embodiments of inventive concept are directed to a semiconductor device inspection method, and more particularly, to a pitch walk inspection method that inspects a pitch walk with respect to a line and space (L/S) pattern of a semiconductor device and method of manufacturing a semiconductor device that includes a pitch walk inspection method.

DISCUSSION OF THE RELATED ART

Multi-patterning technology (MPT), such as double patterning technology (DPT) or quadruple patterning technology (QPT), is used to pattern small-pitch L/S patterns that are challenging to implement with single patterning technology in a semiconductor process. In MPT, a patterning process for an L/S pattern larger than the pitch of a target pattern to be formed is performed a plurality of times. For example, the most common patterning degradation issue is a pitch walk. Pitch walk refers to a phenomenon in which, as the pitch of a final L/S pattern that corresponds to a target pattern changes, two or more L/S patterns are paired with each other, thereby deteriorating the uniformity of patterning.

SUMMARY

Embodiments of the inventive concept provide a pitch walk inspection method that quickly and accurately inspects a pitch walk for a line and space (L/S) pattern of a semiconductor device and a method of manufacturing a semiconductor device that includes the pitch walk inspection method.

According to an embodiment of the inventive concept, there is provided a scanning electron microscope (SEM) image-based pitch walk inspection method. The method includes obtaining an SEM image for a line and space (L/S) pattern formed through multi-patterning technology (MPT), wherein the L/S pattern includes a plurality of lines and spaces that are alternately arranged; detecting a main pitch of the L/S pattern in the SEM image; dividing a graph of the main pitch into graphs of component pitches, based on the MPT; performing a Fast Fourier Transform (FFT) on each graph of the component pitches; multiplying a phase graph and an intensity graph of the FFT of each of the graphs of the component pitches with each other and obtaining compensated FFT phase graphs that respectively correspond to the graphs of the component pitches; and calculating a pitch walk of the L/S pattern by obtaining differences between phase peak values of the compensated FFT phase graphs.

According to another embodiment of the inventive concept, there is provided a scanning electron microscope (SEM) image-based pitch walk inspection method. The method includes obtaining an SEM image for a line and space (L/S) pattern formed by a double patterning technology (DPT), where the L/S pattern includes a plurality of lines and spaces that are alternately arranged; detecting a main pitch of the L/S pattern in the SEM image; dividing a graph of the main pitch into two graphs of component pitches; performing a Fast Fourier Transform (FFT) on each of the two graphs of the component pitches; multiplying a phase graph and an intensity graph of the FFT of each of the two graphs of the component pitches with each other and obtaining two compensated FFT phase graphs that respectively correspond to the two graphs of the component pitches; and calculating a pitch walk of the L/S pattern by obtaining differences between phase peak values of the two compensated FFT phase graphs.

According to another embodiment of the inventive concept, there is provided a scanning electron microscope (SEM) image-based pitch walk inspection method. The method includes obtaining an SEM image for a line and space (L/S) pattern formed by a quadruple patterning technology (QPT), wherein the L/S pattern includes a plurality of lines and spaces that are alternately arranged; detecting a main pitch of the L/S pattern in the SEM image; dividing a graph of the main pitch into four graphs of component pitches; performing a Fast Fourier Transform (FFT) on each of the four graphs of the component pitches; multiplying a phase graph and an intensity graph of the FFT of each of the four graphs of the component pitches with each other and obtaining four compensated FFT phase graphs that respectively correspond to the four graphs of the component pitches; and calculating a pitch walk of the L/S pattern by obtaining a largest difference of differences between phase peak values of the four compensated FFT phase graphs.

According to another embodiment of the inventive concept, there is provided a method of manufacturing a semiconductor device. The method includes forming a line and space (L/S) pattern on a substrate by a multi-patterning technology (MPT), wherein the L/S pattern includes a plurality of lines and spaces that are alternately arranged; obtaining a scanning electron microscope (SEM) image for the L/S pattern; detecting a main pitch of the L/S pattern in the SEM image; dividing a graph of the main pitch into graphs of component pitches, based on the MPT; performing a Fast Fourier Transform (FFT) on each graph of the component pitches; multiplying a phase graph and an intensity graph of the FFT of each of the graphs of the component pitches with each other and obtaining compensated FFT phase graphs that respectively correspond to the graphs of the component pitches; calculating a pitch walk of the L/S pattern by obtaining differences between phase peak values of compensated FFT phase graphs; determining whether the pitch walk is within an allowable range; and, when the pitch walk is within the allowable range, performing a subsequent semiconductor process.

BRIEF DESCRIPTION OF THE DRAWINGS

FIG. 1 is a flowchart of a process of a scanning electron microscope (SEM) image-based pitch walk inspection method according to an embodiment of the inventive concept.

DETAILED DESCRIPTION

FIG. 1 is a flowchart of a scanning electron microscope (SEM) image-based pitch walk inspection method according to an embodiment of the inventive concept, and FIGS. 2A to 2D are pictures and graphs that illustrate an operation of obtaining an SEM image, an operation of squeezing, an operation of detecting a main pitch, and an operation of performing a Fast Fourier Transform (FFT), in relation to the pitch walk inspection method of FIG. 1.

Figure 2A:
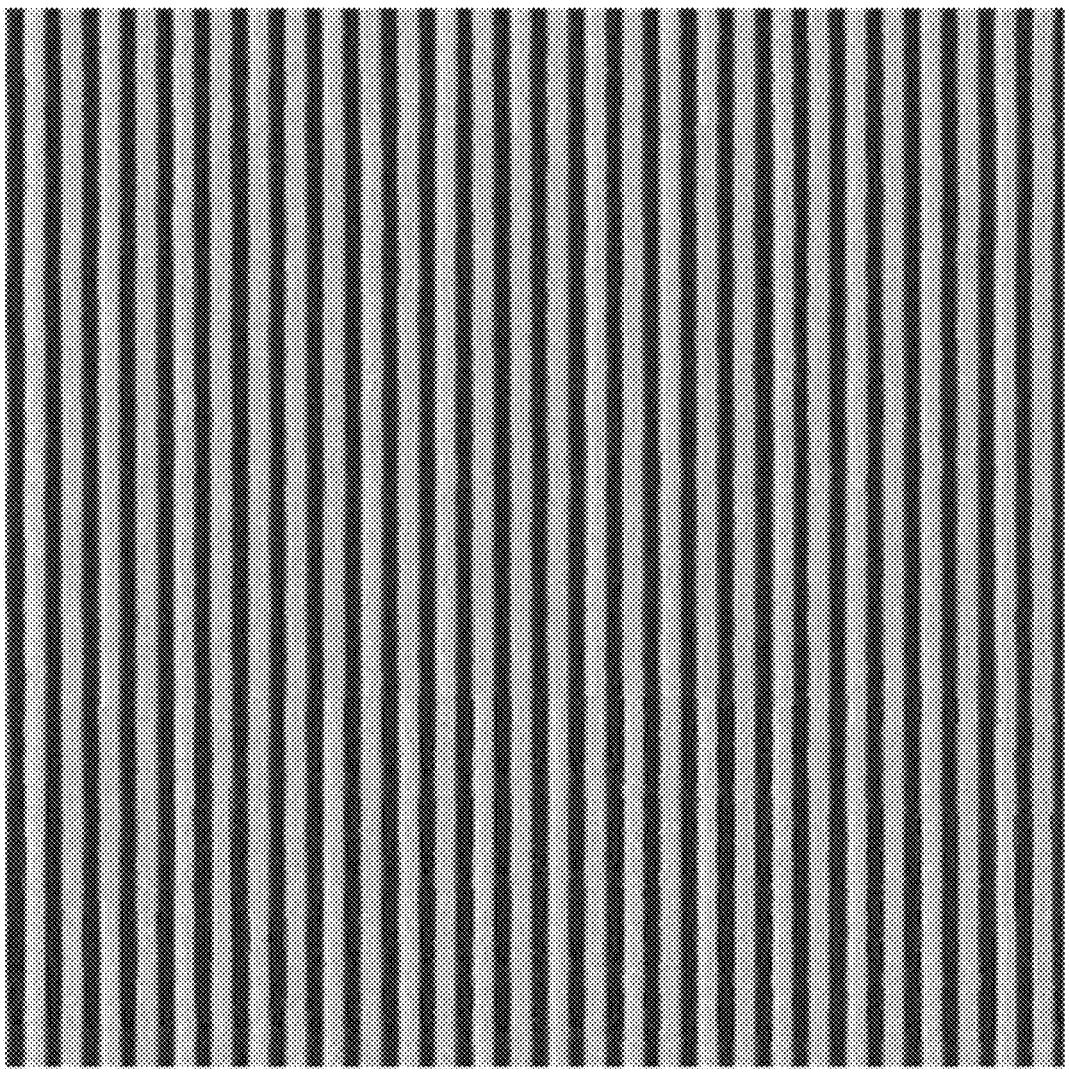
FIGS. 2A to 2D are pictures and graphs that illustrate an operation of obtaining an SEM image, an operation of squeezing, an operation of detecting a main pitch, and an operation of performing a Fast Fourier Transform (FFT), in relation to a pitch walk inspection method of FIG.

Referring to FIGS. 1 and 2A, according to an SEM image-based pitch walk inspection method of an embodiment, hereinafter, simply referred to as a 'pitch walk inspection method', an SEM image regarding a line and space (L/S) pattern formed using a multi-patterning technology (MPT) is obtained (operation S110). FIG. 2A is a photograph of an SEM image of a L/S pattern. The L/S pattern includes a plurality of white portions and black portions that are alternately arranged. In the SEM image, the white portion corresponds to lines and the black portion corresponds to spaces. For example, the intensity of the lines is high and the intensity of the spaces is low. The lines and spaces extend in a second direction (y direction) and are alternately arranged in a first direction (x direction) that crosses the second direction. However, the lines and the spaces do not have a uniform intensity in the second direction (y direction). For example, the intensity may slightly vary in the second direction (y direction) in one line or one space.

In an MPT process, the lines correspond to spacers and the spaces correspond to bars. In an MPT process, spacers are formed on both sides of a bar pattern and the bar pattern is removed after the spacers are formed. Hereinafter, the terms "line" and "spacer" may be used interchangeably, and the terms "space" and "bar" may be used interchangeably.

Figure 2B:
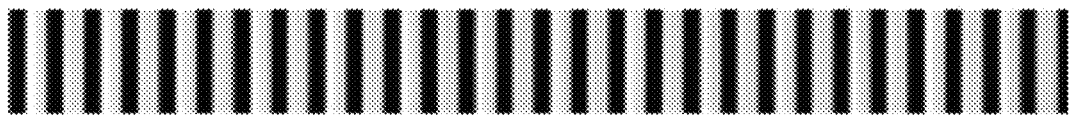

Referring to FIGS. 1 and 2B, in an embodiment, after an SEM image is obtained, squeezing is performed on the SEM image (operation S120). Squeezing is a process of reconstructing an image by averaging the intensity of each position in the first direction (x direction) over the entire second direction (y direction). A squeezed image obtained by squeezing the SEM image of FIG. 2A is shown in FIG. 2B.

As described above, lines and spaces in an SEM image may have a non-uniform intensity. This non-uniform intensity may cause undesirable results in subsequent processes, such as the preparation of an intensity graph and an FFT. Therefore, a process of uniformly representing the intensity of lines and spaces according to positions is performed. Such a process corresponds to squeezing. Through the squeezing process, a 2-dimensional SEM image is converted into a 1-dimensional intensity profile. On the other hand, unnecessary signals in an SEM image are removed by filtering before a squeezing process.

Figure 2C:
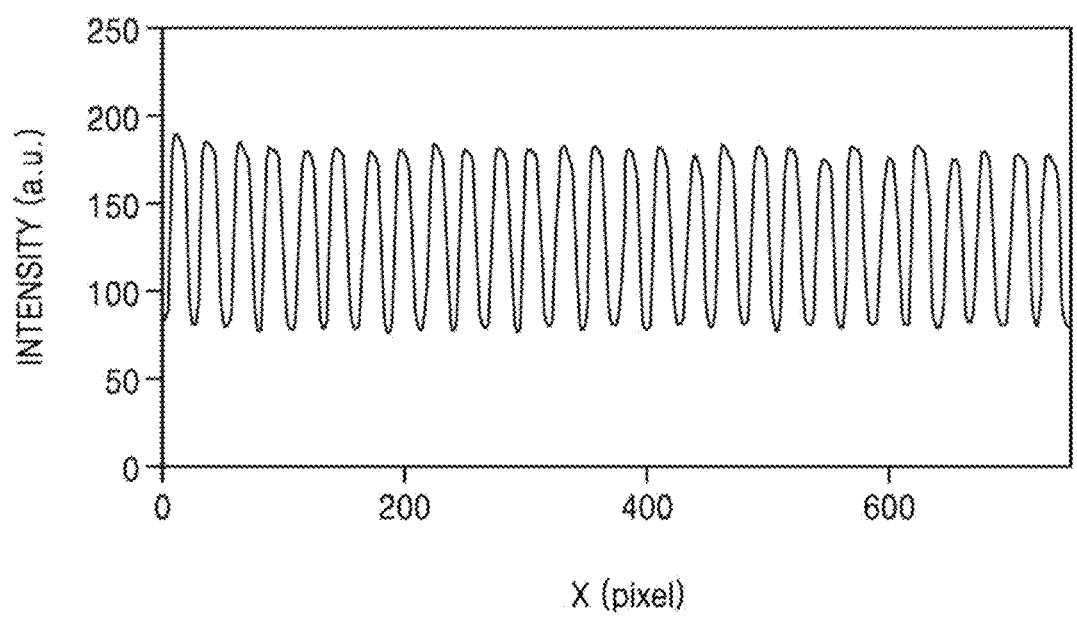

Referring to FIGS. 1 and 2C, in an embodiment, a squeezed image may be displayed as a graph of intensity as a function of position. For example, as shown in FIG. 2C, the squeezed image of FIG. 2B may be displayed as a graph of intensity as a function of position in the first direction (x-direction). In FIG. 2C, the x-axis represents positions in the SEM image, wherein the units thereof is the number of pixels. In addition, the y-axis represents intensity, wherein the units thereof are arbitrary (a.u.).

After squeezing is performed, the main pitch of an L/S pattern is detected from a squeezed image (operation S130). For example, an intensity graph of respective positions is generated from the squeezed image, and the main pitch of the L/S pattern is detected from the graph. The main pitch corresponds to a distance between adjacent peaks in the graph. In addition, a critical dimension (CD) of a line or a space of the L/S pattern is calculated from the graph. The calculation of the main pitch and the CD of the L/S pattern will be described in more detail below with reference to FIGS. 4A to 4C.

Referring again to FIG. 1, in an embodiment, after the main pitch is detected, the graph of the main pitch is divided into graphs of component pitches based on the MPT (operation S140). Two or more graphs of component pitches are defined according to the MPT. For example, when the MPT is a double patterning technology (DPT), there are two graphs of component pitches. When the MPT is a triple patterning technology (TPT), there are three graphs of component pitches. When the MPT is a quadruple patterning technology (QPT), there are four graphs of component pitches. In addition, in the graphs of the component pitches, a component pitch has the size of an integer multiple of the main pitch. In addition, in the case of a DPT that corresponds to two graphs of component pitches, a component pitch has a size that is twice the size of the main pitch. In addition, in the case of a QPT that corresponds to four graphs of component pitches, a component pitch has a size that is four times the size of the main pitch. Graphs of component pitches according to the type of the MPT and a process of dividing the graph of a main pitch into graphs of component pitches will be described below in more detail with reference to FIGS. 5A to 6E.

Figure 2D:
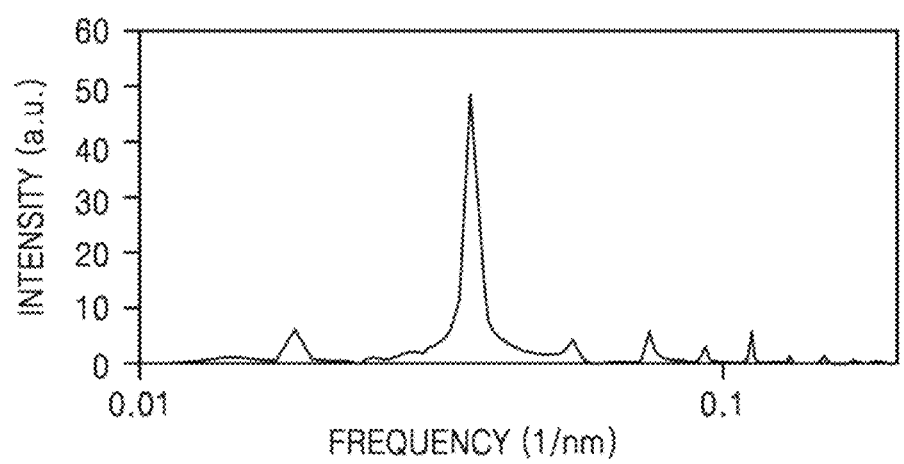

Referring to FIGS. 1 and 2D, in an embodiment, after dividing an intensity graph of the main pitch into intensity graphs of component pitches, an FFT is performed on each intensity graph of the component pitches (operation S150). Through the FFT, the intensity graphs of the component pitches are converted into phase and intensity graphs that are functions of frequency. Hereinafter, the 'intensity graph of the main pitch' will be simply referred to as a 'graph of the main pitch', and the 'intensity graph of a component pitch' will be simply referred to as a 'graph of a component pitch'.

FIG. 2D is a graph of intensity as a function of frequency, which is a result of converting the graph of the main pitch through an FFT. Since the frequency is '1/period', when the period is time, the frequency is expressed in units of '1/time'. When the period is a distance, the frequency is expressed in units of '1/distance'. In the graph of FIG. 2D, the central maximum peak position corresponds to a fundamental frequency of the main pitch. Moreover, the smaller peaks to the right of the fundamental frequency correspond to harmonic frequencies. In addition, the small peak on the left corresponds to a fundamental frequency of a component pitch in graphs of component pitches according to the MPT.

Referring again to FIG. 1, in an embodiment, after performing the FFT, compensated FFT phase graphs that correspond to the graphs of the component pitches are obtained (operation S160). Each of the compensated FFT phase graphs is formed by multiplying an FFT phase graph by an FFT intensity graph of each of the graphs of the component pitches. For example, in the case of a DPT that has two component pitch graphs, a first compensated FFT phase graph that corresponds to the first component pitch graph is obtained by multiplying an FFT phase graph by an FFT intensity graph that correspond to the first component pitch graph. In addition, a second compensated FFT phase graph that corresponds to the second component pitch graph is obtained by multiplying an FFT phase graph by an FFT intensity graph that corresponding to the second component pitch graph. Obtaining a compensated FFT phase graph will be described below in more detail with reference to FIGS. 5A to 6E.

Thereafter, a difference between phase peak values of compensated FFT phase graphs is obtained, and a pitch walk for the L/S pattern is calculated (operation S170). When a difference between phase peak values is obtained, a pitch walk is calculated as a distance through a simple equation and numerical conversion. A process of calculating a pitch walk from a difference between phase peak values will be described below in more detail with reference to FIGS. 7A and 7B.

In addition, compensated FFT phase graphs that correspond to component pitch graphs have substantially the same fundamental frequency and have a maximum phase peak at the fundamental frequency. Therefore, for comparison of phase peak values, the compensated FFT phase graphs that correspond to component pitch graphs are shown together in one graph.

According to a pitch walk inspection method of an embodiment, a pitch walk is accurately calculated by obtaining an SEM image for an L/S pattern, dividing a graph of a main pitch into graphs of component pitches based on the MPT, obtaining compensated FFT phase graphs for the respective graphs of the component pitches through an FFT, and calculating differences between phase peak values of the compensated FFT phase graphs. In addition, according to a pitch walk inspection method of an embodiment, an above-stated process of calculating a pitch walk can be implemented as an automatic calculation tool. Therefore, when an SEM image for an L/S pattern formed through the MPT and the type of the MPT are input, a pitch walk for the L/S pattern is automatically and quickly calculated. Therefore, a pitch walk inspection method of an embodiment increases accuracy and speed of an inspection of a pitch walk for an L/S pattern of a semiconductor device, and as a result, the reliability and the mass production speed of a semiconductor device is increased.

For reference, for a conventional pitch walk inspection method, CD values may fluctuate depending on the SEM CD measurement conditions, and thus, errors may occur. In addition, during a pitch walk measurement for an L/S pattern formed through the QPT, because a pitch walk is measured by comparing only three CDs within a pitch of a layout pattern (refer to L1 of FIG. 3), errors due to changes in widths of spacers can occur. On the other hand, in a pitch walk inspection method of an embodiment, since a pitch walk is automatically calculated through an FFT based on an SEM image, CD value fluctuations that depend on SEM CD measurement conditions does not occur. In addition, since all four CDs within a pitch of a layout pattern are compared with each other, errors due to changes in widths of spaces are also eliminated. The occurrence of an error due to changes in widths of spacers during a pitch walk measurement will be described below in more detail with reference to FIGS. 10A to 11B.

Figure 3:
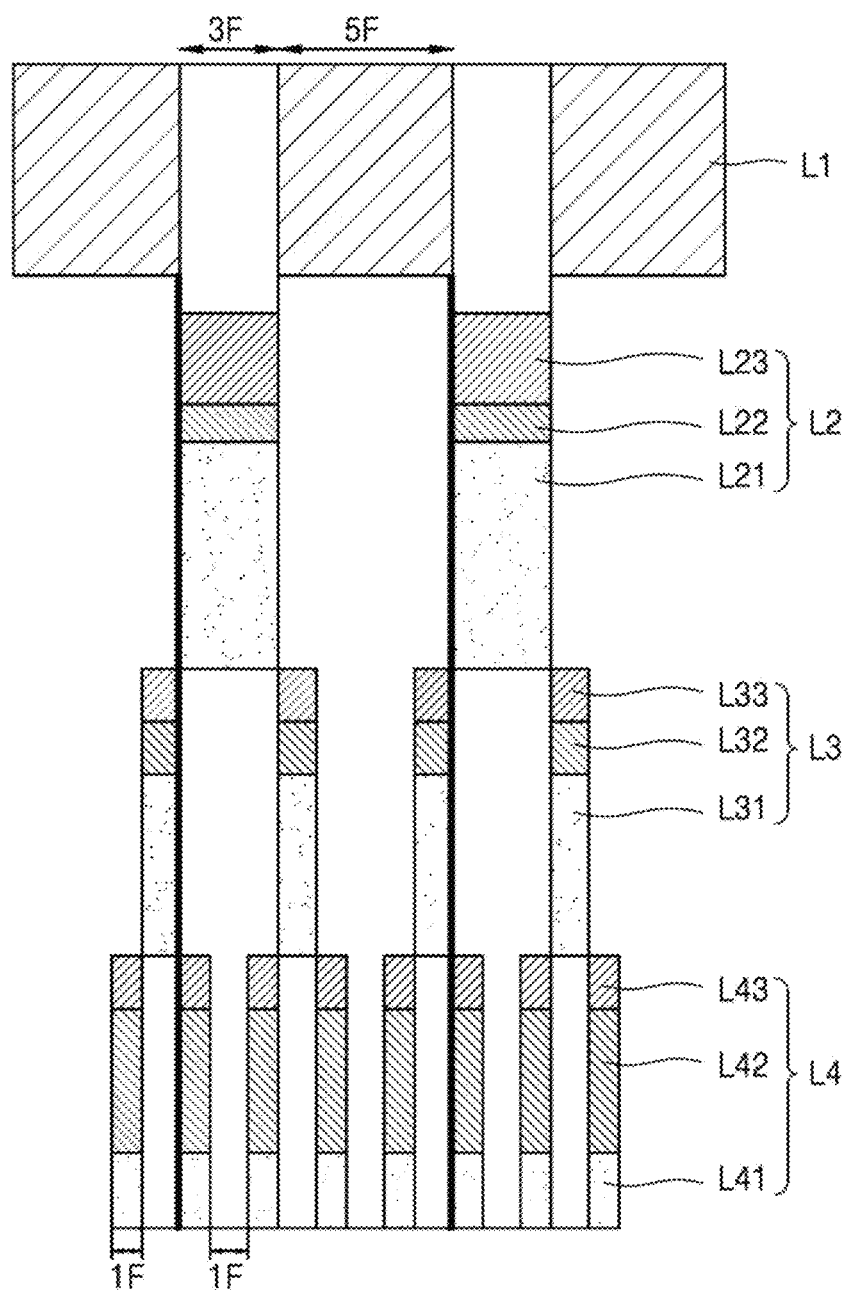
FIG. 3 illustrates a quadruple patterning technology (QPT) in relation to a pitch walk inspection method of FIG. 1.

FIG. 3 illustrates a QPT in relation to a pitch walk inspection method of FIG. 1.

Referring to FIG. 3, in an embodiment, a layout pattern L1 is shown at the top, and the pitch of the layout pattern L1 corresponds to 8F. Here, 1F corresponds to the width of a final target pattern, e.g., the width of a line or a spacer. At L2, a photoresist (PR) pattern L23 is formed on a first insulating layer L21 and an anti-reflection layer L22. The first insulating layer L21 includes spin-on-hardmask (SOH), and the anti-reflection layer L22 includes SiON. However, the materials of the first insulating layer L21 and the anti-reflection layer L22 are not necessarily limited thereto. The PR pattern L23 is formed through a photolithography process. Moreover, at L2, the first insulating layer L21 and the anti-reflection layer L22 are connected to each other without being patterned.

After the PR pattern L23 is formed, a first spacer layer that covers the PR pattern L23 and the anti-reflection layer L22 is formed to a thickness of 1F. The first spacer layer is formed of an oxide layer through, for example, atomic layer deposition (ALD). However, the method and the material that forms the first spacer layer are not necessarily limited thereto. Thereafter, the first spacer layer is removed from the top surfaces of the PR pattern L23 and the anti-reflection layer L22 by an etch-back process, thereby forming a first spacer L33.

After the first spacer L33 is formed, the PR pattern L23 is removed, and thus, only the first spacer L33 remains on the anti-reflection layer L22. The PR pattern L23 is removed, for example, through an ashing process and a strip process. Thereafter, the anti-reflection layer L22 and the first insulating layer L21 are etched by using the first spacer L33 as an etch mask, thereby forming an anti-reflection layer pattern L32 and a first insulating layer pattern L31. The etching is, for example, dry etching. In addition, a conductive layer and a second insulation layer are formed in the lower portion of L3. The conductive layer includes, for example, polysilicon, and the second insulation layer includes, for example, Tetra-Ethyl Ortho-Silicate (TEOS). However, the materials of the conductive layer and the second insulation layer are not necessarily limited thereto.

A second spacer layer that covers L3 and the conductive layer is formed to a thickness of 1F. The second spacer layer is formed of an oxide layer by, for example, ALD. However, a method and a material that forms the second spacer layer are not necessarily limited thereto. A second spacer L43 is formed by removing the second spacer layer from the top surfaces of L3 and the conductive layer by etch-back.

After the second spacer L43 is formed, L3 is removed, and thus, only the second spacer L43 remains on the conductive layer. L3 is removed, for example, by an ashing process and a strip process. The conductive layer is etched by using the second spacer L43 as an etch mask, thereby forming a conductive layer pattern L42. The second insulation layer is etched by using the conductive layer pattern L42 as an etch mask, thereby forming a second insulation layer pattern L41. Thereafter, the conductive layer pattern L42 is removed, and only the second insulation layer pattern L41 that corresponds to a target pattern remains. The width and the interval of the second insulation layer pattern L41 corresponds to 1F.

FIG. 3 shows two thick lines that correspond to the pitch of the layout pattern L1, and four second insulation layer patterns L41 are included between the two thick lines. Therefore, a QPT is a process of forming a target pattern that has a pitch that corresponds to ¼ of the pitch of the layout pattern. Similarly, a DPT is a process of forming a target pattern that has a pitch that corresponds to ½ the pitch of the layout pattern, and a TPT is a process of forming a target pattern that has a pitch that corresponds to ⅓ of the pitch of the layout pattern.

On the other hand, in an MPT, patterning non-uniformity, such as a pitch walk, occurs repeatedly for every pitch of the layout pattern. For example, a patterning non-uniformity occurs for every two L/S patterns in DPT and occurs for every four L/S patterns in QPT.

For reference, in a conventional pitch walk inspection method, a pitch walk is inspected by measuring CD values and simultaneously comparing the CD values with each other as an SEM image is obtained. For example, in DPT, CDs of bars within 2×pitch are measured as average values for L/S patterns of two consecutive groups, and an absolute value of the difference between the CDs is calculated as a pitch walk. In addition, in the case of the QPT, CDs of bars within 4×pitch are measured as average values for L/S patterns of three consecutive groups, and the largest absolute value of the differences between the CDs is calculated as a pitch walk. However, when the pitch walk is calculated as described above, the pitch walk may vary depending on a method of measuring SEM CDs. For example, in a conventional pitch walk inspection method, deviation of CD values up to 0.5 nm may occur depending on a measurement device or a condition or a tool that measures CDs, such as a measurement method. Therefore, for the same SEM image, the pitch walk can be calculated differently according to a measurement device or a method for measuring SEM CDs. In addition, in a conventional pitch walk inspection method, since CDs cannot be measured for all regions of an SEM image, the entire pitch walk is inspected based on results of measuring CDs of a partial region. Therefore, a result that differs from actual pitch walks of other regions may be obtained.

On the contrary, in a pitch walk inspection method of an embodiment, as described with reference to FIGS. 4A to 4C, average CDs are uniformly calculated based on the intensity of the L/S pattern. In addition, as described with reference to FIGS. 5A to 6E, by using an FFT, a pitch walk is quickly and accurately calculated.

Figure 4A:
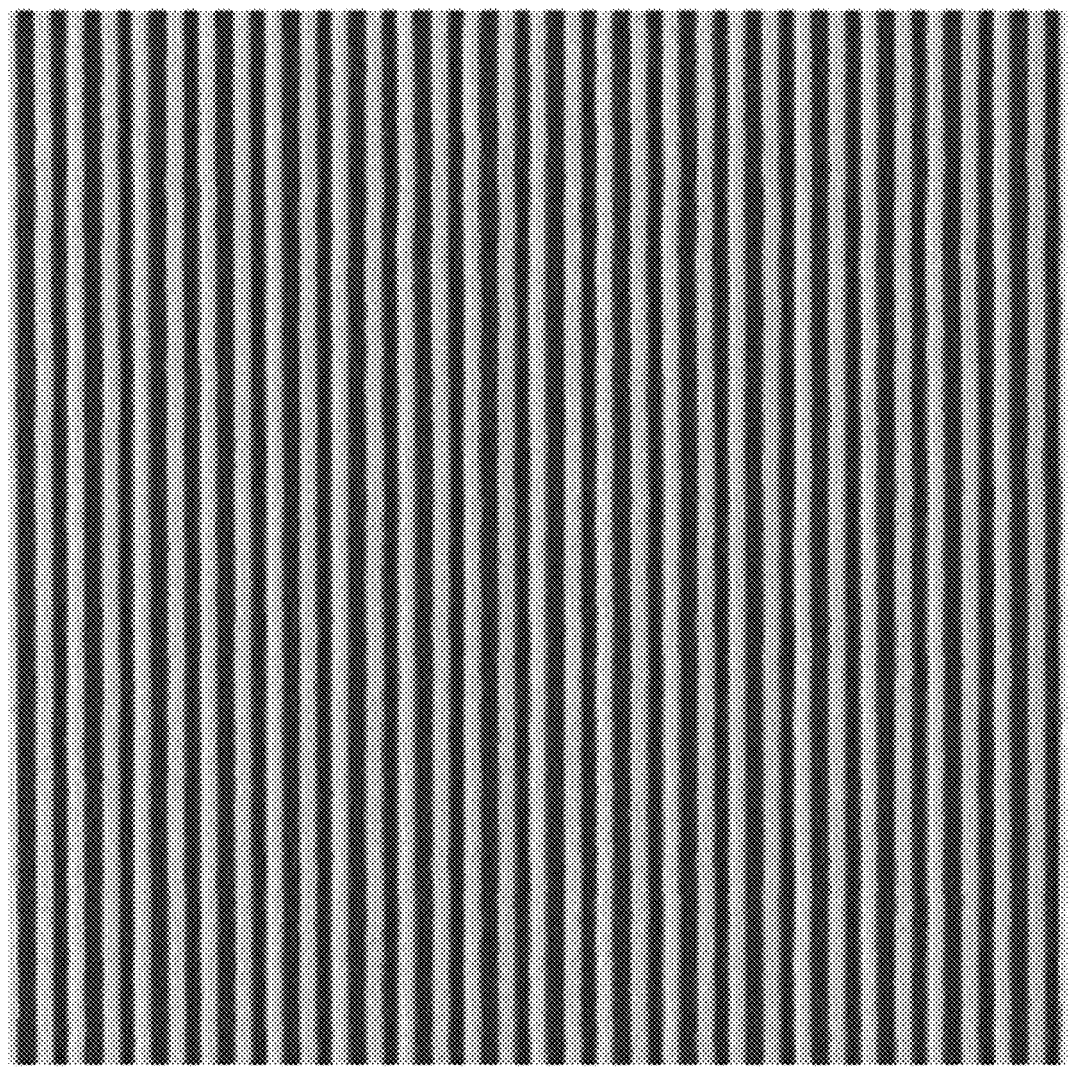
FIGS. 4A to 4C are photographs and graphs that illustrate detection of a main pitch and calculation of CDs in relation to a pitch walk inspection method of FIG. 1.
Figure 4B:
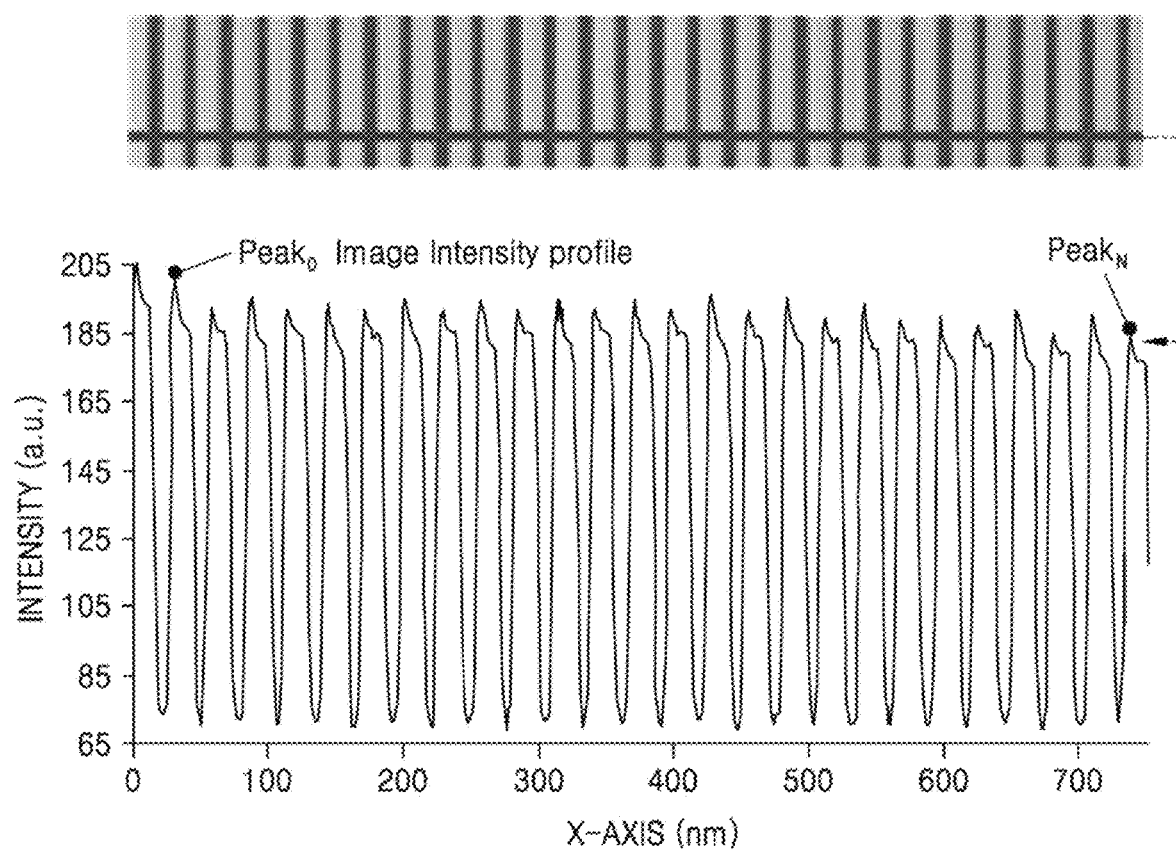
Figure 4C:
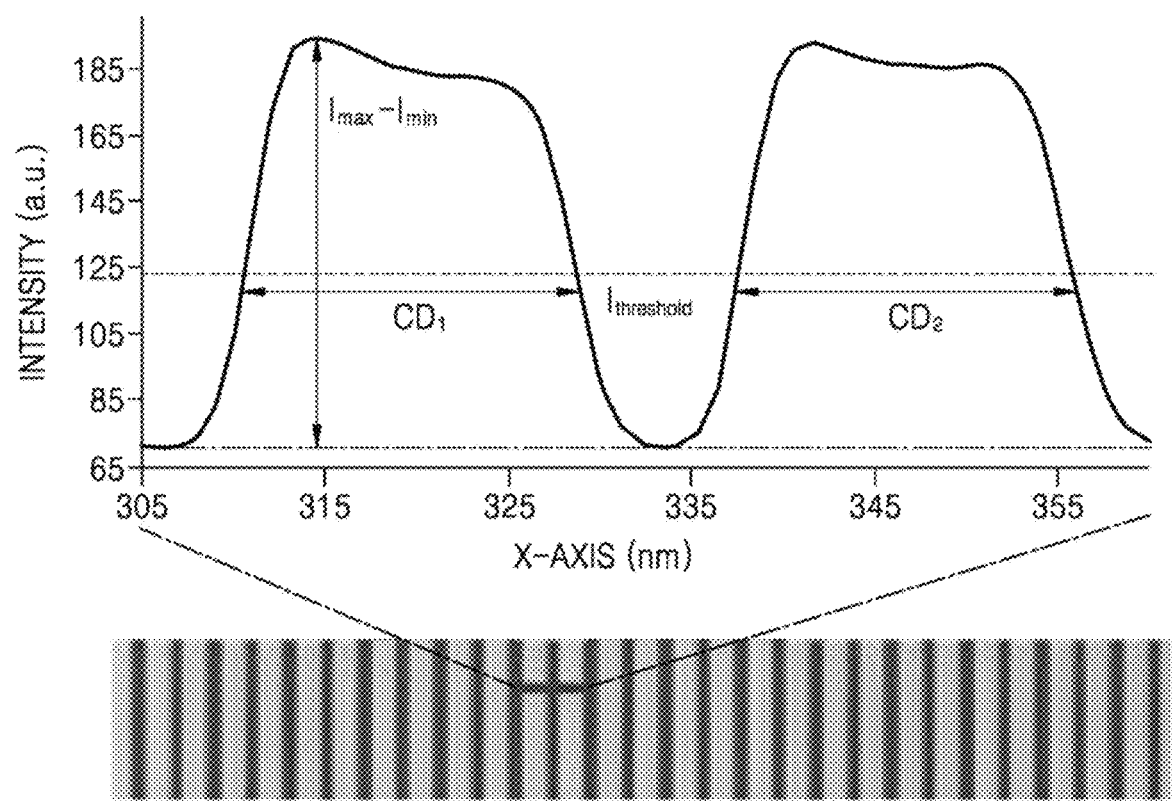

FIGS. 4A to 4C are photographs and graphs that illustrate detection of a main pitch and calculation of CDs in relation to a pitch walk inspection method of FIG. 1.

Referring to FIGS. 4A and 4B, in an embodiment, the SEM image of FIG. 4A is converted into a squeezed image, as shown in the upper part of FIG. 4B, through a squeezing process. Thereafter, the squeezed image is represented as an intensity graph as a function of positions, as shown in the lower part of FIG. 4B. In addition, the pitch of an L/S pattern is automatically calculated based on the intensity graph. For example, in the intensity graph, denoting a first peak position $Peak_0$ and an n+1-th peak position by $Peak_n$, the pitch of the L/S pattern is calculated as $(Peak_n - Peak_0)/n$. In addition, the pitch of the L/S pattern calculated as described above corresponds to the main pitch and is distinguished from a component pitch to be described below.

Referring to FIGS. 4A and 4C, in an embodiment, the SEM image of FIG. 4A is converted into a squeezed image, as shown in the lower part of FIG. 4C, through a squeezing process. Moreover, an enlarged graph of intensity that corresponds to two lines is shown in the upper part of FIG. 4C. In a pitch walk inspection method of an embodiment, CDs are automatically calculated by setting a threshold intensity $I_{threshold}$ and recording positions that exceed the threshold intensity $I_{threshold}$ near each peak. In addition, CDs for peaks are averaged to calculate an average CD.

In FIG. 4C, the threshold intensity $I_{threshold}$ is indicated by a dashed line, and CDs CD1 and CD2 of lines are indicated by double arrows in a portion that corresponds to the threshold intensity $I_{threshold}$. For reference, the threshold intensity $I_{threshold}$ is set as, for example, ½ of a value obtained by subtracting the minimum intensity Imin from the maximum intensity Imax.

FIGS. 5A to 5E are graphs that illustrate an operation of detecting a main pitch to an operation of obtaining a compensated FFT phase graph when an L/S pattern is formed by using DPT in a pitch walk inspection method of FIG. 1. Descriptions already given above with reference to FIGS. 1 to 4 are summarized or omitted.

Figure 5A:
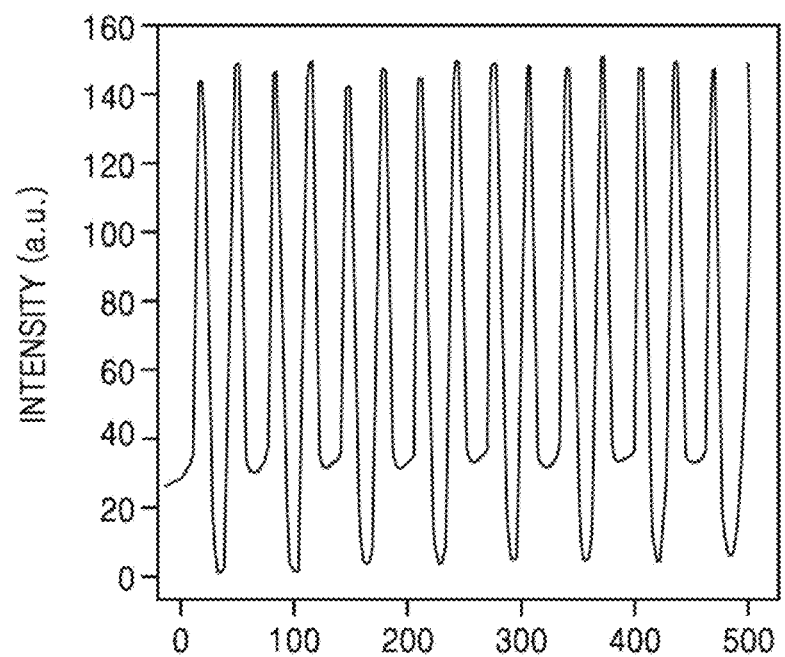
FIGS. 5A to 5E are graphs that illustrate an operation of detecting a main pitch to an operation of obtaining a compensated FFT phase graph when an L/S pattern is formed by using double patterning technology (DPT) in a pitch walk inspection method of FIG. 1.

Referring to FIG. 5A, in an embodiment, as described with reference to FIGS. 2A to 2C, a graph of intensity as a function of positions is obtained by squeezing an SEM image for an L/S pattern. In FIG. 5A, the x-axis represents positions in pixels, and the y-axis represents intensity in an arbitrary unit. In addition, positions of peaks correspond to central positions of lines of the L/S pattern. In addition, a distance between adjacent peaks corresponds to the main pitch.

Figure 5B:
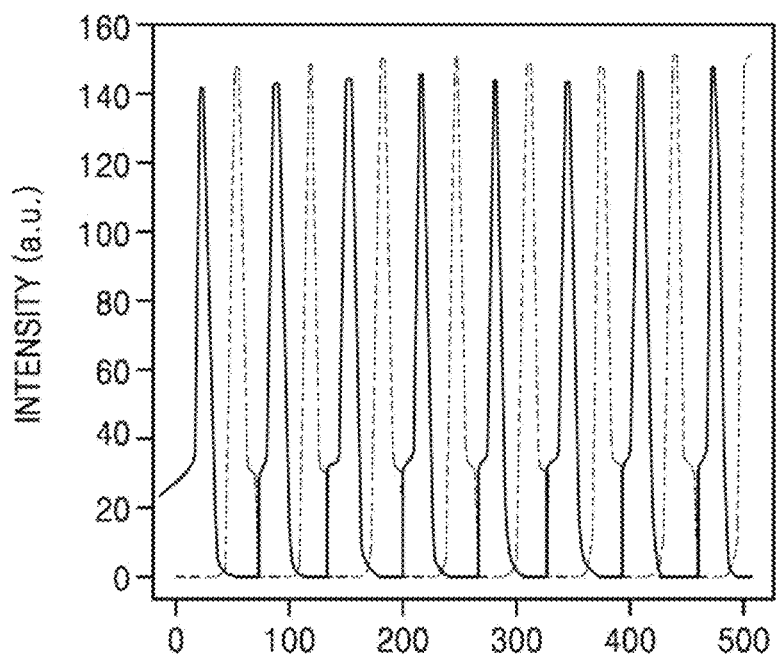

Referring to FIG. 5B, in an embodiment, a graph of the main pitch, for example, the graph of FIG. 5A, is divided into two graphs having component pitches. For example, as shown in FIG. 5B, the graph of FIG. 5A is divided into a first graph ① indicated by a solid line and a second graph ② indicated by a dashed line. In the first graph ①, a distance between adjacent peaks corresponds to a first component pitch, where the first component pitch is twice the main pitch. In addition, in the second graph ②, a distance between adjacent peaks corresponds to a second component pitch, where the second component pitch is also twice the main pitch. For example, the first component pitch and the second component pitch are substantially the same.

Figure 5C:
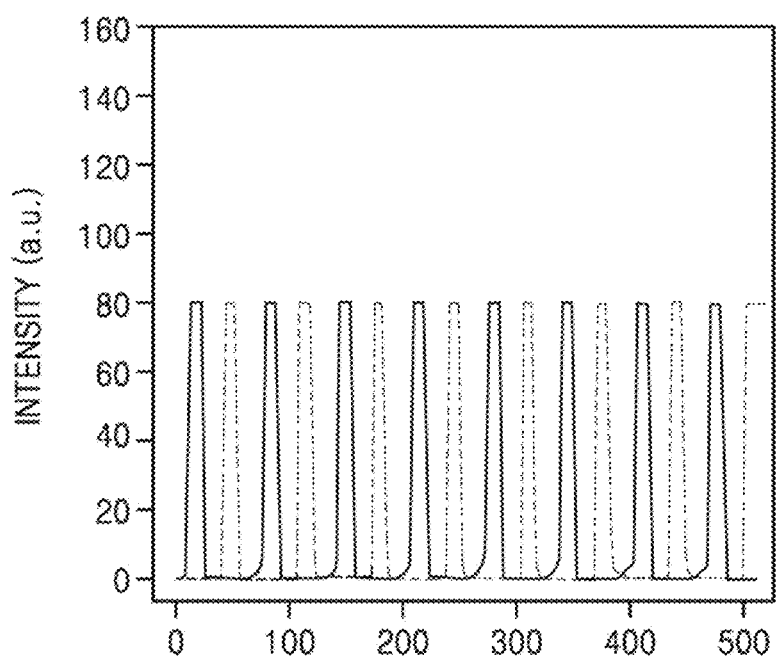

Referring to FIG. 5C, in an embodiment, the shapes of the first graph ① and the second graph ② are converted into smoother shapes by signal processing. For example, in the graph of FIG. 5A, first minimum points are located in a portion of intensity 0 and second minimum points are located in a portion of intensity 30. Here, to simplify the shape of a result of an FFT, the graph is converted by signal processing, such that the intensity in a portion of intensity 30 becomes 0.

Figure 5D:
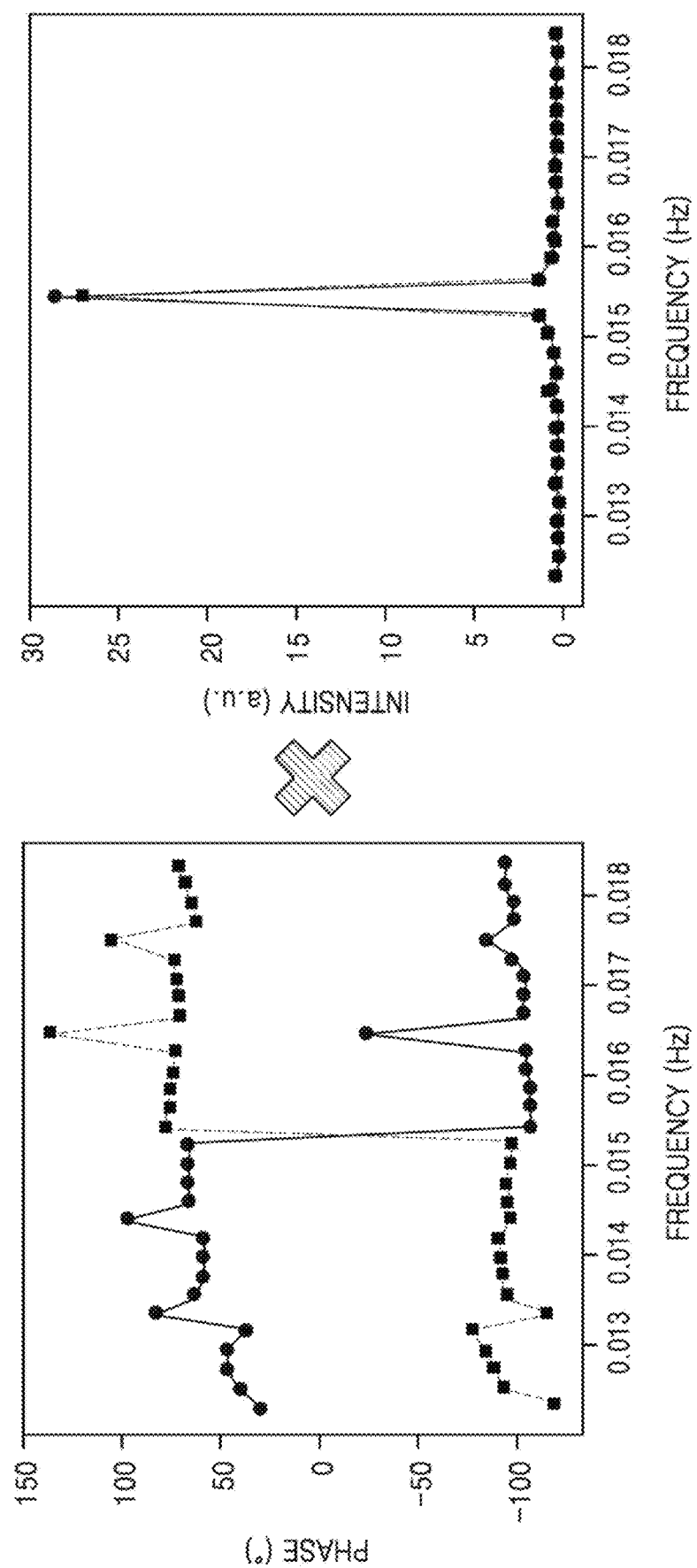

Referring to FIG. 5D, in an embodiment, an FFT is performed on the first graph ① and the second graph ② of FIG. 5C to obtain phase graphs and intensity graphs as functions of frequencies. The left graph is an FFT phase graph, where a solid line corresponds to the first graph ① and a dashed line corresponds to the second graph ②. In addition, the right graph is an FFT intensity graph, where a solid line corresponds to the first graph ① and a dashed line corresponds to the second graph ②. For reference, in the FFT phase graph and the FFT intensity graph, the frequency (Hz) of the x-axis is in units of 1/pixel based on the pixel unit of the x-axis of FIGS. 5A to 5C.

As shown in FIG. 5D, in an embodiment, the FFT phase graphs show that a large phase change occurs at frequencies that correspond to the first component pitch and the second component pitch. In addition, the FFT intensity graphs show that the intensity has the largest values at the frequencies that correspond to the first component pitch and the second component pitch, that is, peak values, and the intensity is almost 0 at other frequencies. As described above, the first component pitch and the second component pitch are substantially the same. Therefore, frequencies that correspond to the first component pitch and the second component pitch, such as the fundamental frequencies, are also substantially the same. For example, in the FFT phase graphs and FFT intensity graphs of FIG. 5D, the fundamental frequencies are shown as about 0.0155. In addition, in the FFT intensity graphs, a sub-peak appears at a harmonic frequency of about 0.031.

Figure 5E:
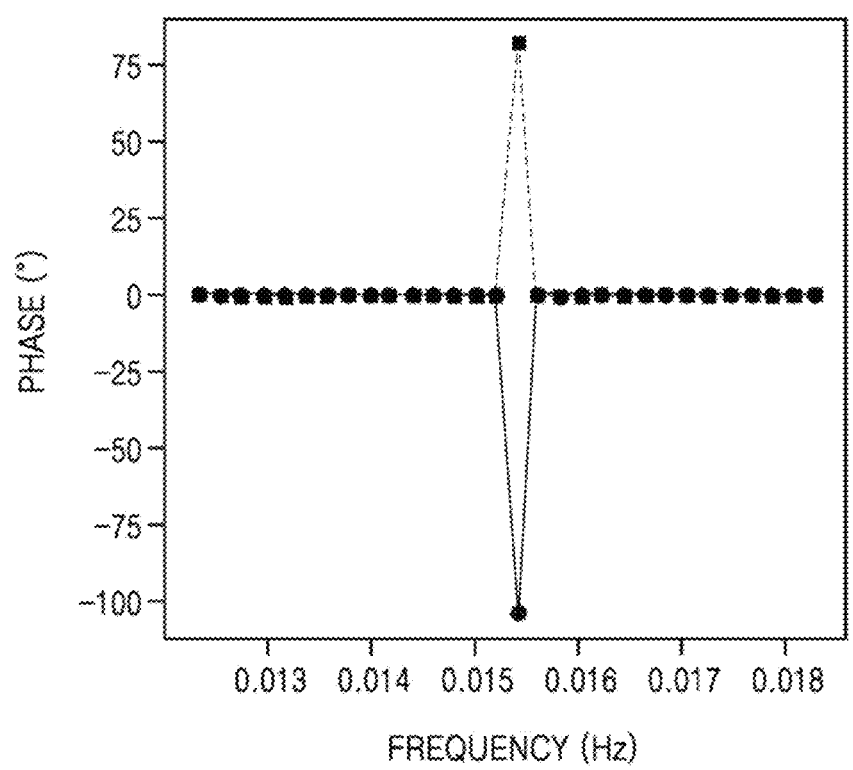

Referring to FIG. 5E, in an embodiment, compensated FFT phase graphs are obtained by multiplying the FFT phase graph by the FFT intensity graph of FIG. 5D. In the compensated FFT phase graphs, a solid line corresponds to the first graph ①, and a dashed line corresponds to the second graph ①. In the FFT intensity graphs of FIG. 5D, since the intensity is 0 at frequencies other than the fundamental frequencies, as shown in FIG. 5E, in each of the compensated FFT phase graphs, the phases appear to be substantially 0 at frequencies other than the fundamental frequencies.

Thereafter, a pitch walk is calculated by obtaining a difference between phase peak values of the compensated FFT phase graphs. For reference, when the difference between the phase peak values is 180°, the pitch walk corresponds to zero. In addition, the further the difference between the phase peak values is from 180°, the larger the pitch walk becomes. The calculation of the pitch walk will be described below in detail with reference to FIGS. 7A and 7B.

FIGS. 6A to 6E are graphs that illustrate an operation of detecting a main pitch to an operation of obtaining a compensated FFT phase graph when an L/S pattern is formed by using QPT in a pitch walk inspection method of FIG. 1. Descriptions already given above with reference to FIGS. 1 to 4 are summarized or omitted.

Figure 6A:
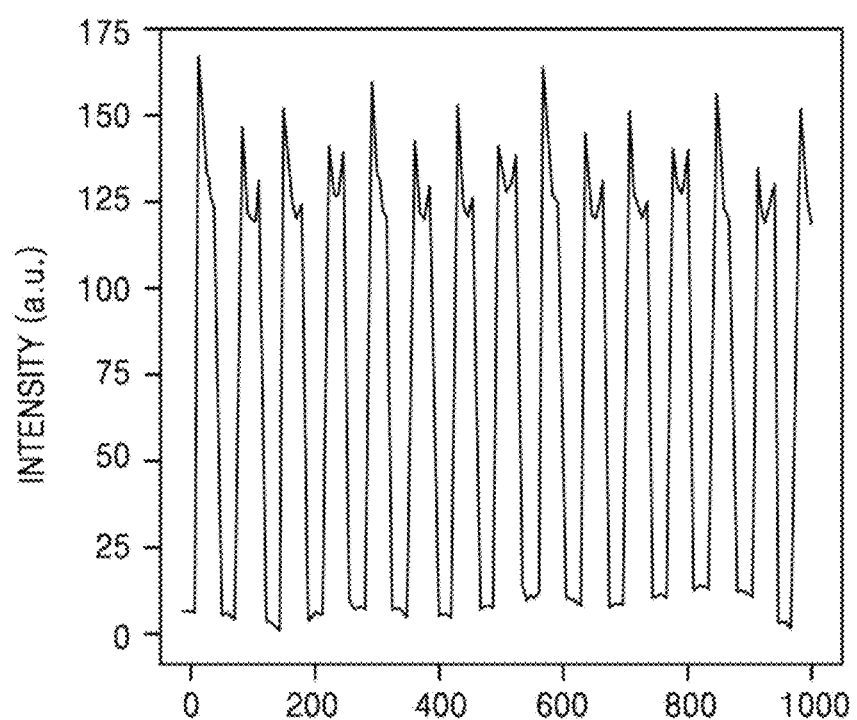
FIGS. 6A to 6E are graphs that illustrate an operation of detecting a main pitch to an operation of obtaining a compensated FFT phase graph when an L/S pattern is formed by using QPT in a pitch walk inspection method of FIG. 1.

Referring to FIG. 6A, in an embodiment, as described with reference to FIGS. 2A to 2C, a graph of intensity graph as a function of positions is obtained by squeezing an SEM image for an L/S pattern. In FIG. 6A, the x-axis represents positions in pixels, and the y-axis represents intensity in an arbitrary unit. In addition, positions of peaks correspond to central positions of lines of the L/S pattern, and a distance between adjacent peaks corresponds to the main pitch.

Figure 6B:
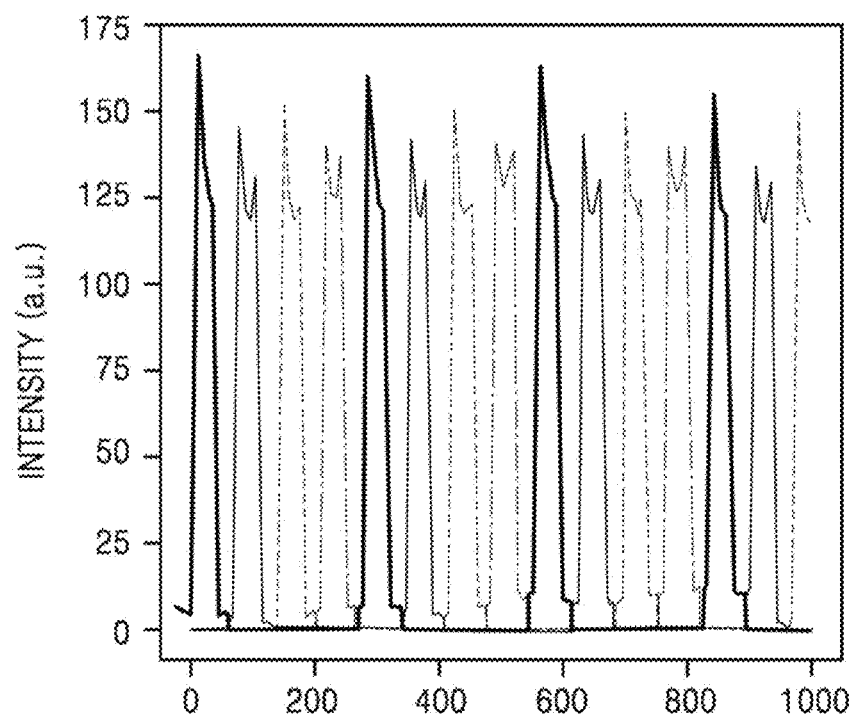

Referring to FIG. 6B, in an embodiment, a graph of the main pitch, for example, the graph of FIG. 6A, is divided into four graphs having component pitches. For example, as shown in FIG. 6B, the graph of FIG. 6A is divided into a first graph ① indicated by a thick solid line, a second graph ② indicated by a thin solid line, a third graph ③ indicated by a dashed line, and a fourth graph ④ indicated by a long-dash short-dash line. Peaks of the first graph ① to the fourth graph ④ alternately occur once every four times.

Each of a first component pitch of the first graph ①, a second component pitch of the second graph ②, a third component pitch of the third graph ③, and a fourth component pitch of the fourth graph ④ corresponds to a distance between adjacent peaks and is four times the main pitch. For example, each of the first component pitch to the fourth component pitch are substantially the same.

Figure 6C:
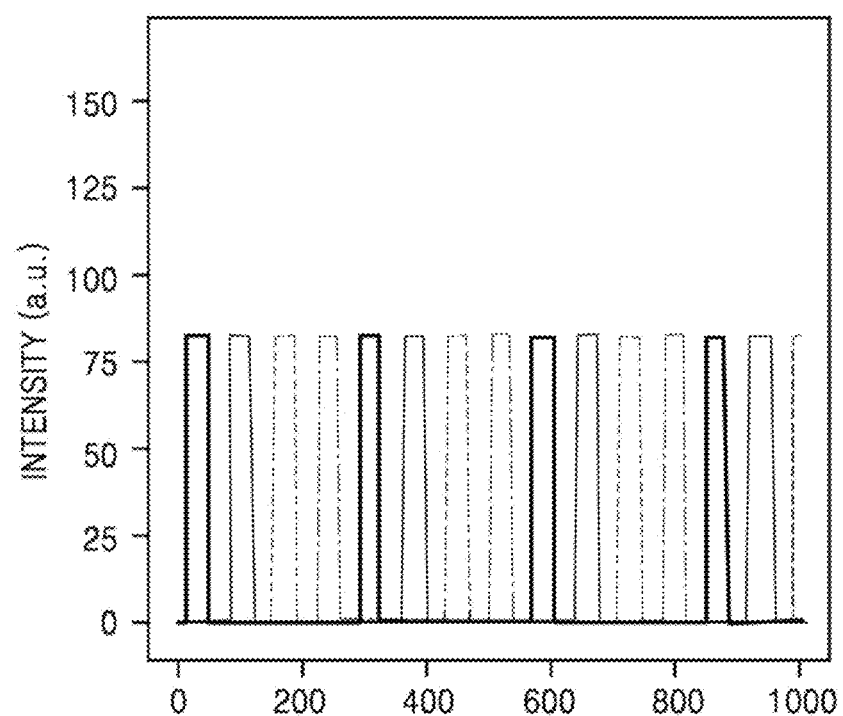

Referring to FIG. 6C, in an embodiment, the shapes of the first graph ① to the fourth graph ④ are converted into smoother shapes by signal processing. The conversion of graphs by signal processing is the same as that described with reference to FIG. 5C.

Figure 6D:
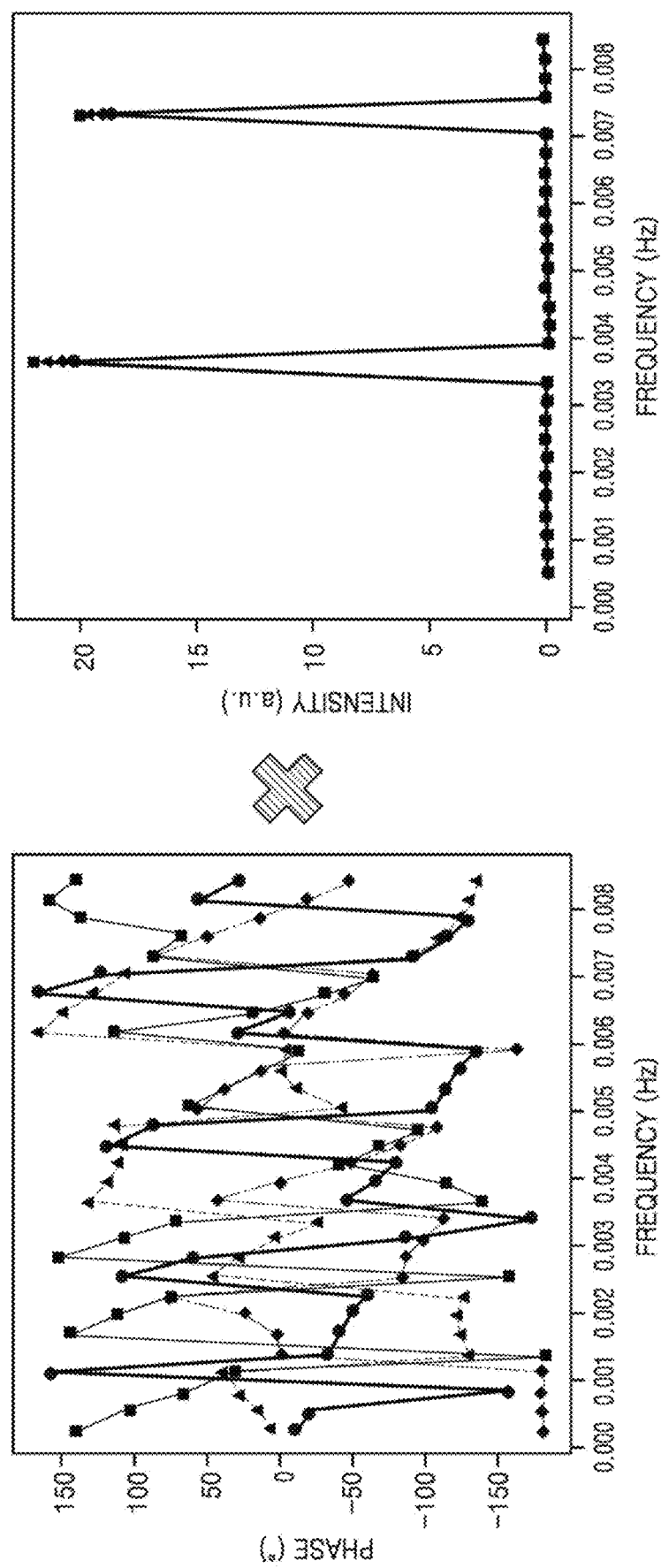

Referring to FIG. 6D, in an embodiment, an FFT is performed on the first graph ① to the fourth graph ④ to obtain phase graphs and intensity graphs as functions of frequencies. The graph on the left part is the FFT phase graph, where the thick solid line corresponds to the first graph ①, the thin solid line corresponds to the second graph ②, the dashed line corresponds to the third graph ③, and the long-dash short-dash line corresponds to the fourth graph ④. In addition, the graph on the right part is the FFT intensity graph, where the thick solid line corresponds to the first graph ①, the thin solid line corresponds to the second graph ②, the dashed line corresponds to the third graph ③, and the long-dash short-dash line corresponds to the fourth graph ④.

As shown in FIG. 6D, the FFT phase graphs show that a large phase change occurs over all the frequencies. In addition, the FFT intensity graphs show that the intensity has the largest values at the frequencies that correspond to the first component pitch to the fourth component pitch, such as peak values, and the intensity is almost 0 at other frequencies. As described above, each of the first component pitch to the fourth component pitch are substantially the same. Therefore, frequencies that correspond to the first component pitch to the fourth component pitch, such as the fundamental frequencies, are also substantially the same. For example, in the FFT intensity graphs on the right, the fundamental frequencies are about 0.0035. In addition, in the case of the FFT intensity graphs on the right, a sub-peak appears at a harmonic frequency of about 0.007.

Figure 6E:
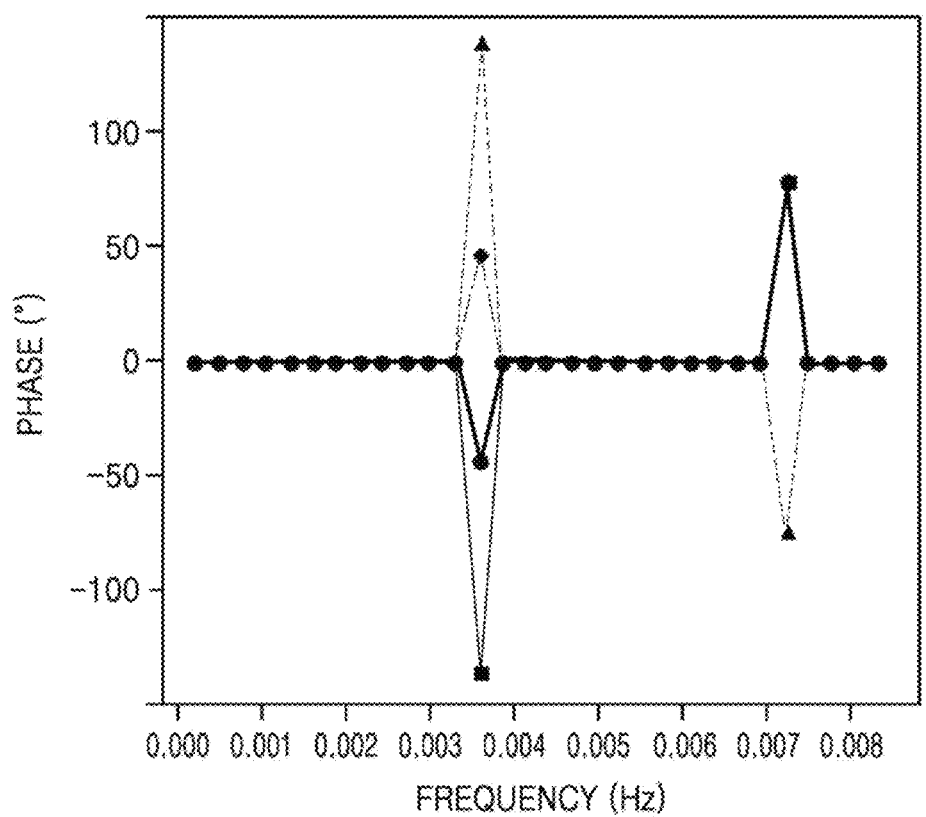

Referring to FIG. 6E, in an embodiment, compensated FFT phase graphs are obtained by multiplying the FFT phase graph by the FFT intensity graph of FIG. 6D. In the compensated FFT phase graphs, the thick solid line corresponds to the first graph ①, the thin solid line corresponds to the second graph ②, the dashed line corresponds to the third graph ③, and the long-dash short-dash line corresponds to the fourth graph ④. In the FFT intensity graphs on the right side of FIG. 6D, since the intensity is 0 at frequencies other than the fundamental frequencies and harmonic frequency, as shown in FIG. 6E, in each of the compensated FFT phase graphs, the phases are substantially 0 at frequencies other than the fundamental frequencies and the harmonic frequency.

Thereafter, a pitch walk is calculated by obtaining a difference between phase peak values of the fundamental frequencies of the compensated FFT phase graphs. As shown in FIG. 6E, there are four compensated FFT phase graphs that corresponding to the first graph ① to the fourth graph ④, respectively, and thus, four phase peak values appear. Therefore, a total of 6 differences between the phase peak values are obtained by combination. For example, assuming that the phase peak values of the compensated FFT phase graphs that correspond to the first graph ① to the fourth graph ④ are P1, P2, P3, and P4, respectively, differences between the phase peak values are P1-P2, P1-P3, P1-P4, P2-P3, P2-P4, and P3-P4, and the largest of these values is determined to be the pitch walk. The calculation of the pitch walk will be described below in detail with reference to FIGS. 7A and 7B. In a calculation of the pitch walk, the phase peak values of the harmonic frequencies are not considered.

Figure 7A:
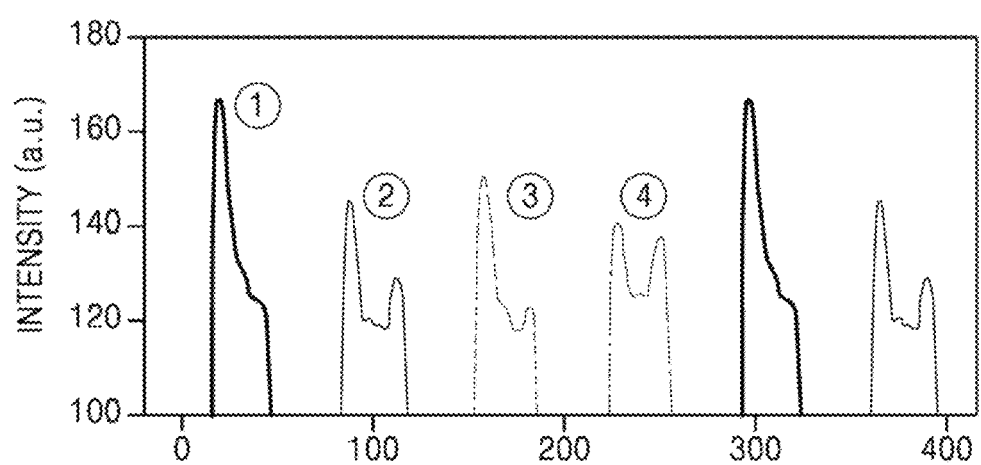
FIGS. 7A and 7B are, respectively, an enlarged intensity graph of an SEM image and an FFT of a particular frequency for an intensity graph in polar coordinates when an L/S pattern is formed through QPT.
Figure 7B:
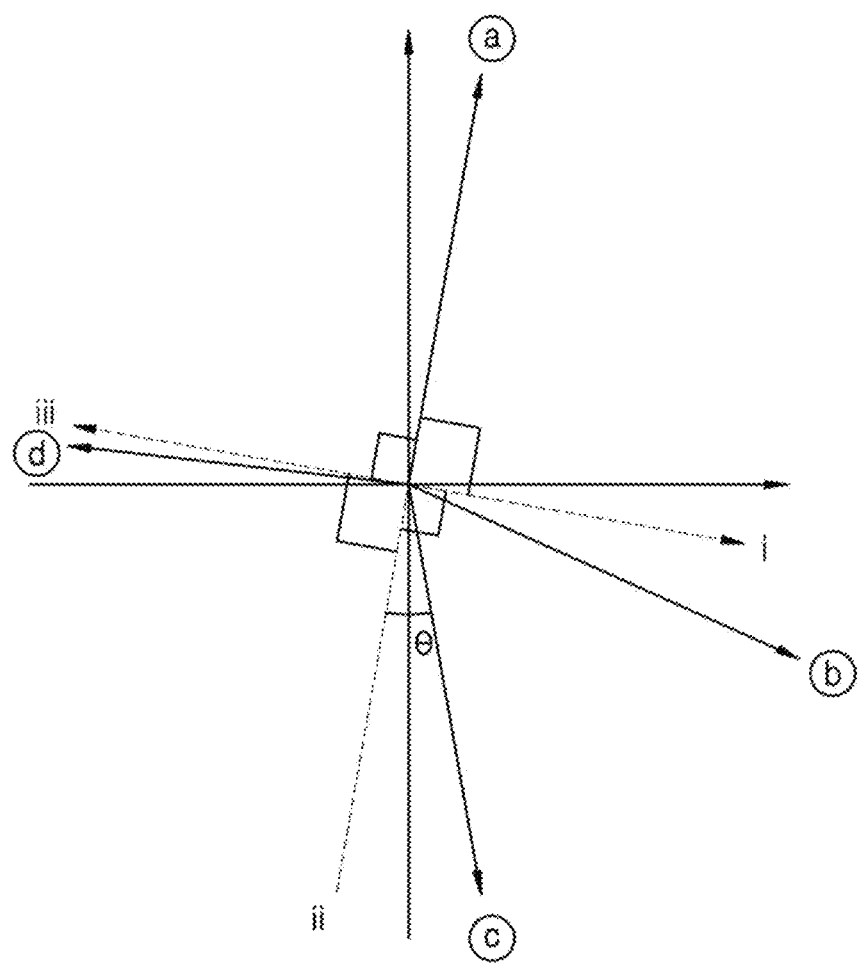

FIGS. 7A and 7B are, respectively, an enlarged intensity graph of an SEM image and an FFT of a particular frequency for an intensity graph in polar coordinates when an L/S pattern is formed through QPT. In FIG. 7A, the x-axis represents positions in pixels, and the y-axis represents intensity in an arbitrary unit.

Referring to FIGS. 7A and 7B, in an embodiment, the thick solid line corresponds to the first graph ①, the thin solid line corresponds to the second graph ②, the dashed line corresponds to the third graph ③, and the long-dash short-dash line corresponds to the fourth graph ④. FIG. 7B shows the FFT of particular frequencies in polar coordinates for the first graph ① to the fourth graph ④, where, letting ⓐ correspond to the first graph ①, i, ii, and iii indicated by dashed lines correspond to perfect FFT lines for the second graph ② to the fourth graph ④, and ⓑ, ⓒ, and ⓓ indicated by solid lines correspond to actual FFT lines for the second graph ② to the fourth graph ④. Accordingly, the difference θ between a perfect FFT line and an actual FFT line corresponds to a phase shift and corresponds to ½ of a pitch walk.

When the L/S pattern is formed through the QPT, as described above, after dividing the graph of a main pitch into graphs of four component pitches, based on differences between phase peak values obtained through an FFT for each of the graphs, the pitch walk is calculated in units of distance, e.g., nm.

For example, based on an SEM image, when calculated in units of pixels, the pitch of a layout pattern of the QPT is 4×32=128 with respect to a pattern having a main pitch of 32. However, when a pitch walk occurs, the distance between patterns becomes 32±α, instead of 32, 32, 32, and 32. The value of α represents a pitch walk and is denoted by PWI, and Equation (1) below may be established for the pitch walk.

$$(PIH+PWI)/MP \times PIH = (2\pi/MP + \theta)/2\pi \quad \text{Equation (1)}$$

Here, MP corresponds to an MPT and is an integer equal to or greater than 2. For example, MP is 2 in the case of DPT, MP 3 in the case of TPT, and 4 in the case of QPT. PIH denotes a main pitch, and MP×PIH corresponds to 2n. In addition, θ corresponds to the phase of the pitch walk. When Equation (1) is rearranged for PWI, $PWI=(\theta \times PIH \times MP)/2\pi$.

Previously, in FIG. 6E, when phase peak values of the compensated FFT phase graphs that correspond to the first graph ① to the fourth graph ④ are P1=(−)43,65°, P2=(−134.59°), P3=135.11°, and P4=44.93°, respectively, differences between the phase peak values are P1-P2=90.94°, P1-P3=(−178.76°), P1-P4=(−88.58°), P2-P3=(−269.70°), P2-P4=(−179.52°), and P3-P4=90.18°. When the differences between the phase peak values are arranged based on 90°×n, P1-P2=0.94°, P1-P3=1.24°, P1-P4=1.42°, P2-P3=0.30°, P2-P4=0.48°, and P3-P4=0.18°. When calculations are performed using these values as θ values, results thereof are PWI(P1-P2)=1.45pix, PWI(P1-P3)=1.92pix, PWI(P1-P4)=2.19pix, PWI(P2-P3)=0.47pix, PWI(P2-P4)=0.74pix, and PWI(P3-P4)=0.27pix. When one pixel has a size of 0.525 nm, PWI(P1-P2)=0.76 nm, PWI(P1-P3)=1.01 nm, PWI(P1-P4)=1.15 nm, PWI(P2-P3)=0.25 nm, PWI(P2-P4)=0.39 nm, and PWI(P3-P4)=0.14 nm. Since the maximum value corresponds to the pitch walk, the final pitch walk of the corresponding L/S pattern is 1.15 nm.

In the previous calculation, for each of the phase peak value differences, PWI was calculated in pixels and converted into PWI in units of distance. However, since 1.42° is the largest of the differences between phase peak values, it is actually only necessary to calculate PWI in pixels and convert PW1 into units of distance for the value.

Figure 8A:
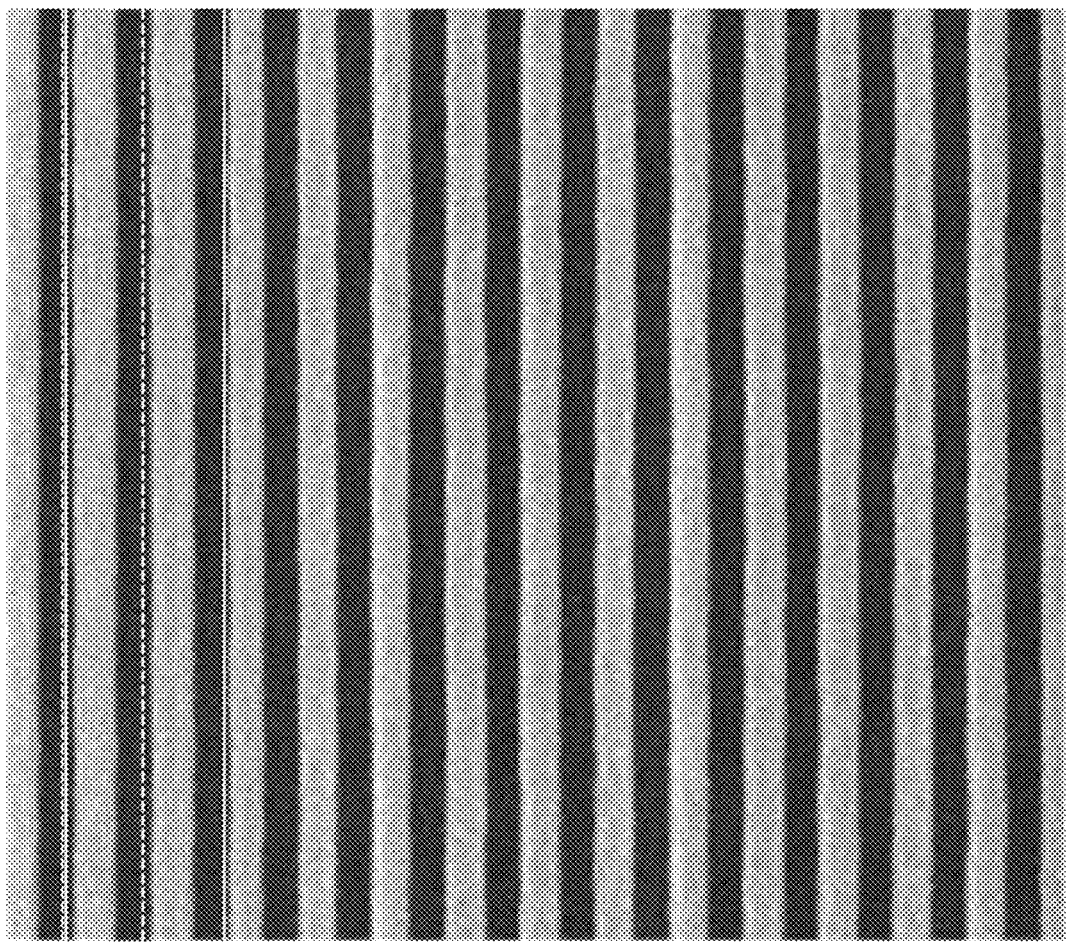
FIGS. 8A to 9C are photographs and graphs of a correlation between a pitch walk inspection method of FIG. 1 and a pitch walk inspection method according to a comparative example when the L/S pattern is formed through QPT.

FIGS. 8A to 9C are photographs and graphs of a correlation between a pitch walk inspection method of FIG. 1 and a pitch walk inspection method according to a comparative example when the L/S pattern is formed through QPT. In the photographs of FIGS. 8A, 9A, and 9B, the dashed lines indicate bars that correspond to a pitch walk calculated according to a pitch walk inspection method of a comparative example due to a large CD difference of four bars within a pitch of a layout pattern, whereas solid lines indicate bars that are formed in the same QPT process and presumed to have the same width. In graphs of FIGS. 8B and 9C, SEM CD indicates a pitch walk inspection method of a comparative example, and SEM-FFT indicates a pitch walk inspection method of an embodiment.

Figure 8B:
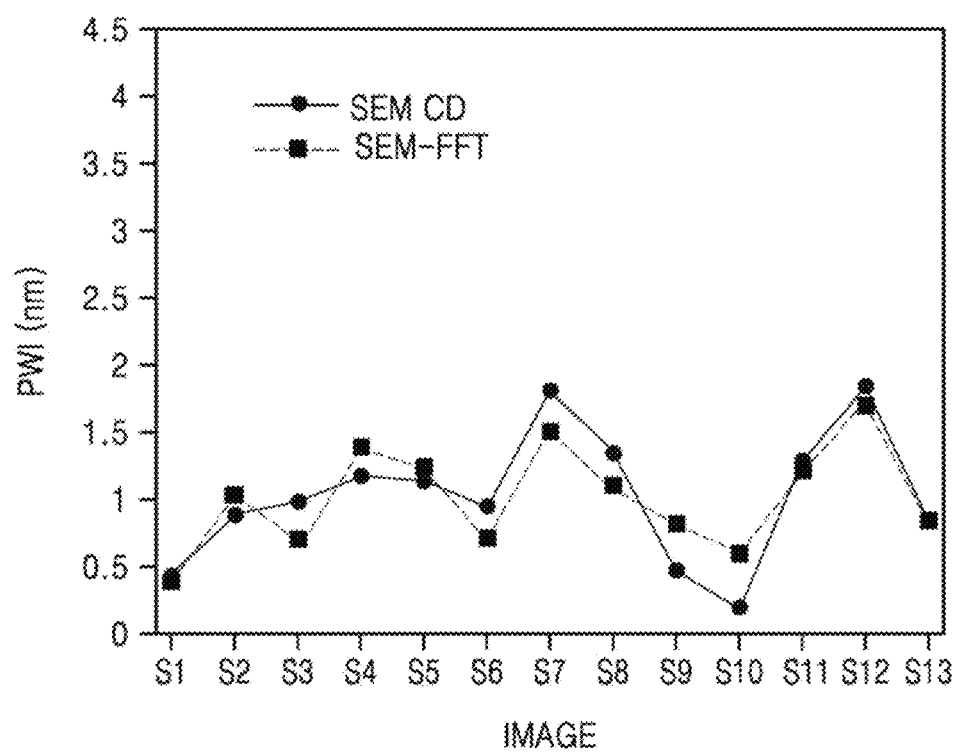

Referring to FIGS. 8A and 8B, in an embodiment, in the SEM image of FIG. 8A, spacers that correspond to lines appear stably with relatively uniform widths. As shown in the graph of FIG. 8B, results of a pitch walk inspection method of an embodiment and results of a pitch walk inspection method of a comparative example so not significantly differ. For example, the correlation appears as high as about 89.2%.

Figure 9A:
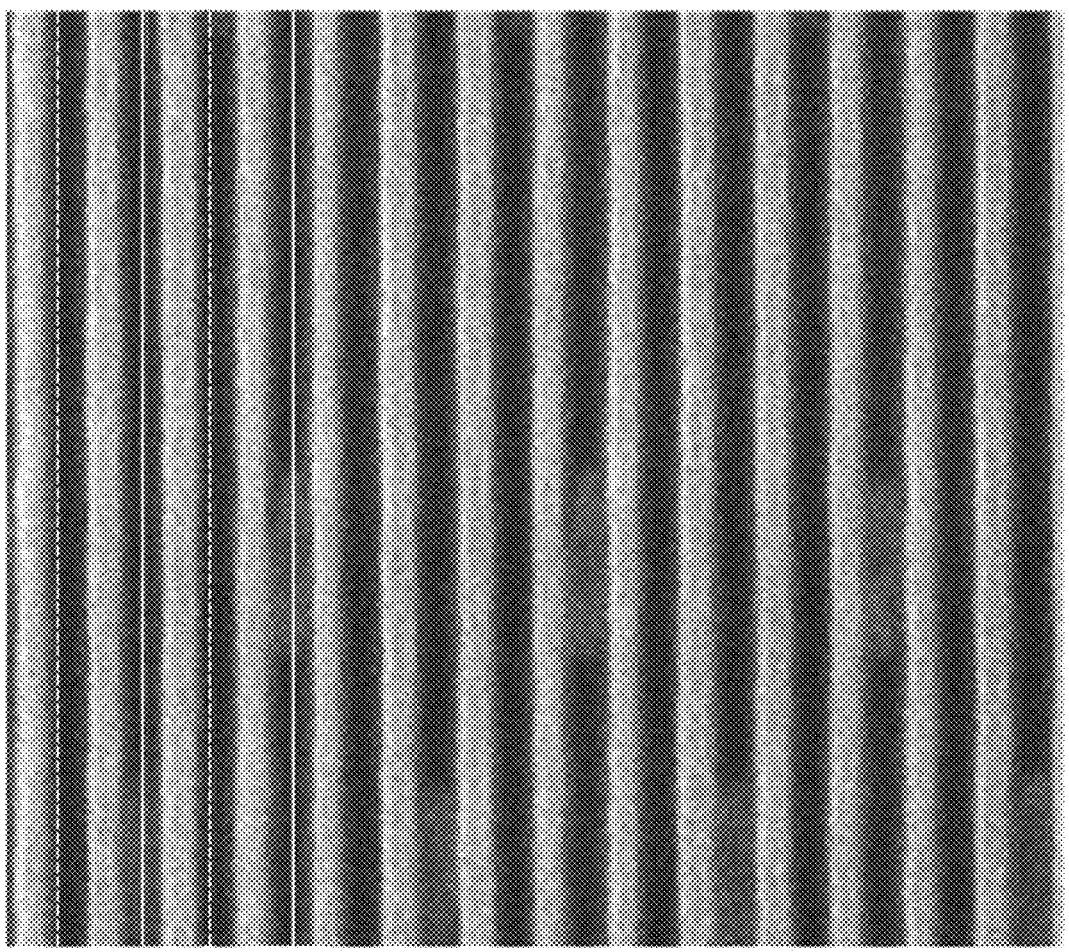
Figure 9B:
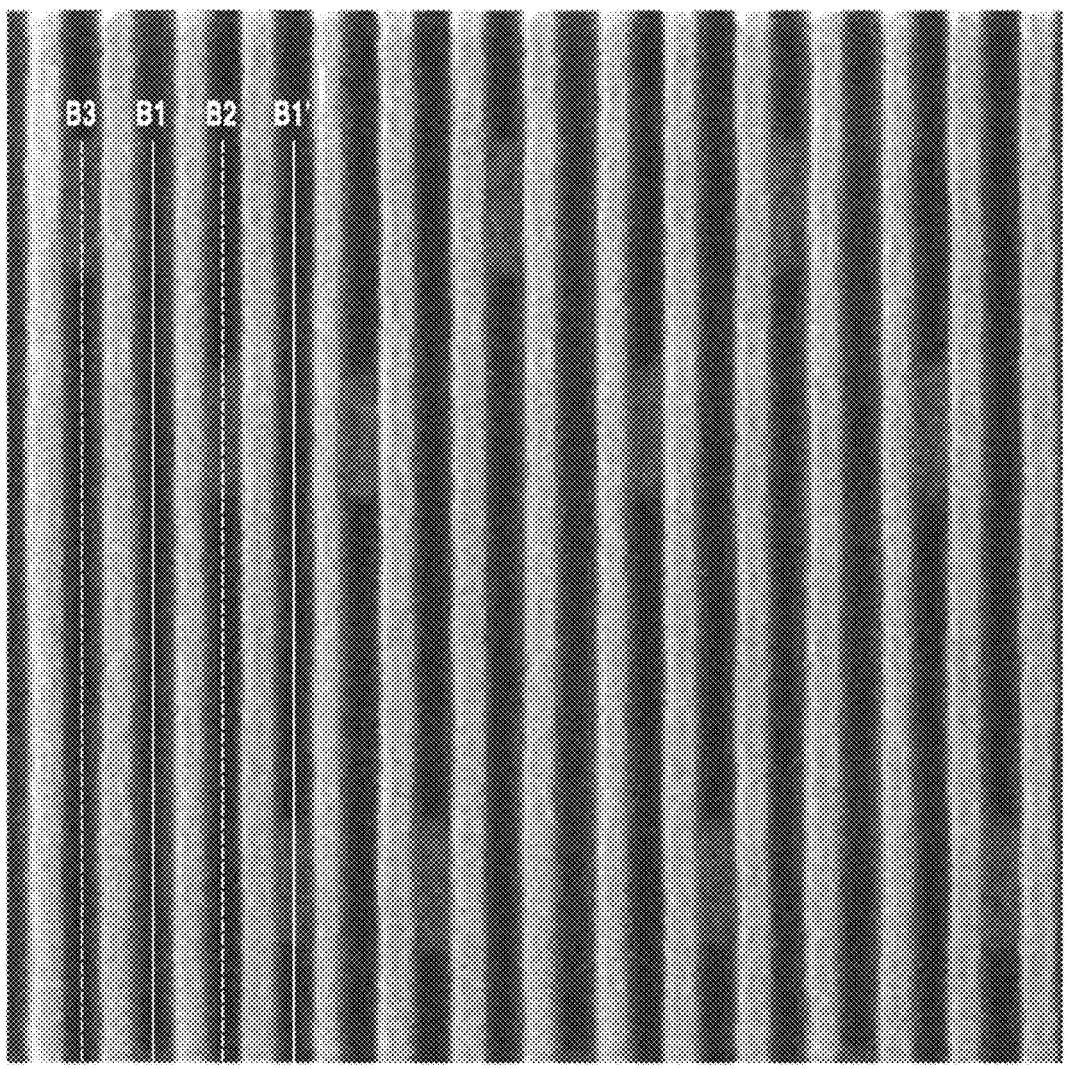
Figure 9C:
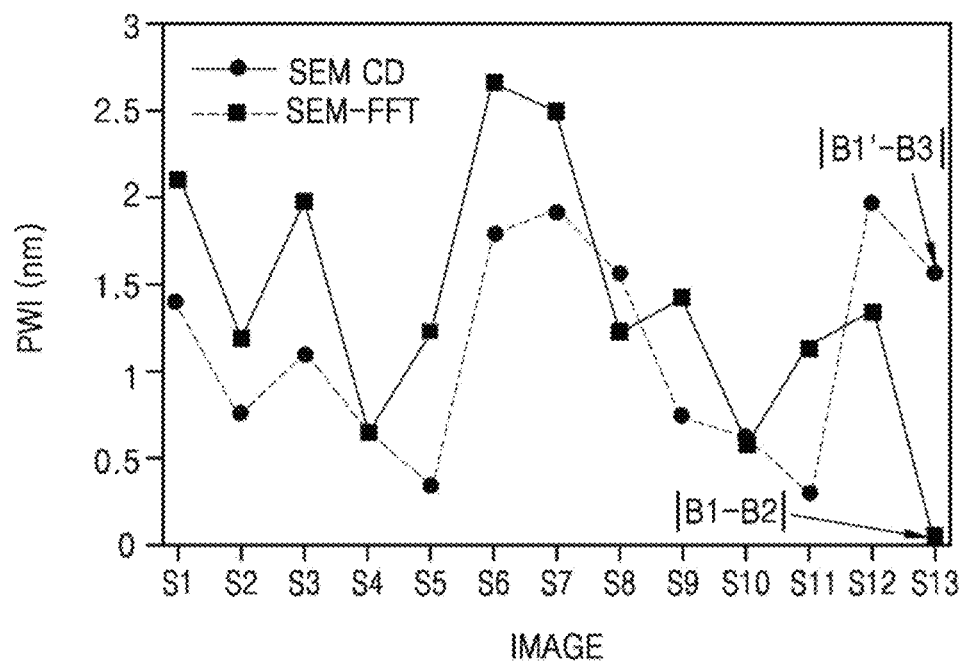

Referring to FIGS. 9A and 9B, in an embodiment, FIGS. 9A and 9B are the same SEM images, in which spacers appear unstably with non-uniform widths. For example, a spacer at the right solid line or spacers on both sides of a solid line B1' appear to be thinner than the other spacers. As shown in the graph of FIG. 9C, results of a pitch walk inspection method of an embodiment and results of a pitch walk inspection method of a comparative example significantly differ. For example, the correlation appears as low as 43%.

To briefly describe a reason thereof based on a result of calculating a pitch walk for the SEM image, in the case of the comparative example, it is assumed that a bar that corresponds to the solid line B1' is the same as a bar that corresponds to the solid line B1. Therefore, CDs are measured with respect to only three bars that correspond to lines B3, B1, and B2, and ABS(B3-B2) that corresponds to the largest CD difference is calculated as a pitch walk. However, in the case of QPT, when widths of spacers change, CDs of portions that correspond to lines B1 and B1' also become different from each other. In a pitch walk inspection method of an embodiment, all bars are measured, and thus, ABS(B1'-B3) that actually corresponds to the largest CD difference is calculated as the pitch walk.

Hereinafter, in a case in which L/S patterns are formed through DPT and QPT, relationships between pitch walks and changes in bars due to changes in widths of spacers will be mathematically described.

Figure 10A:
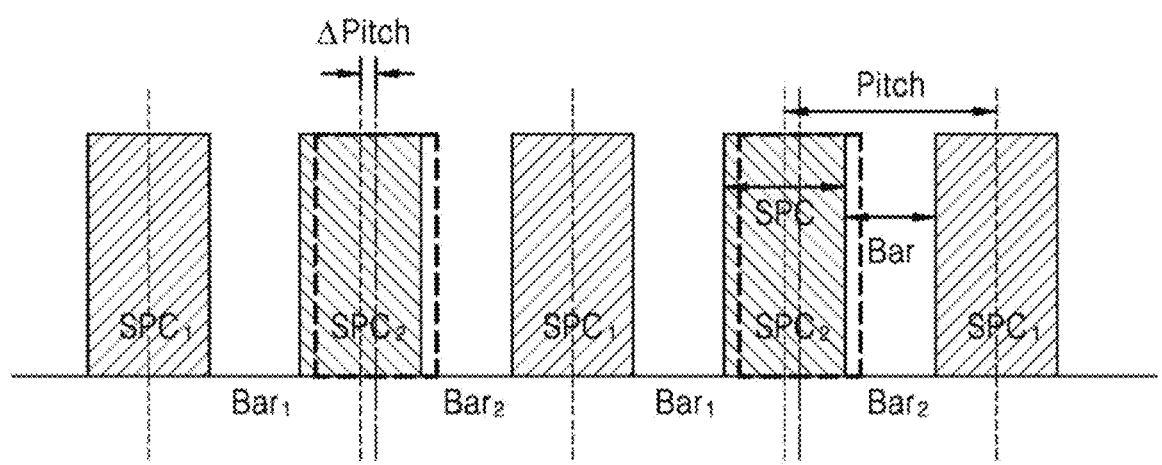
FIGS. 10A and 10B illustrate a relationship between a pitch walk and a change in a space (bar) according to a change in the width of a line (spacer) when an L/S pattern is formed through DPT.
Figure 10B:
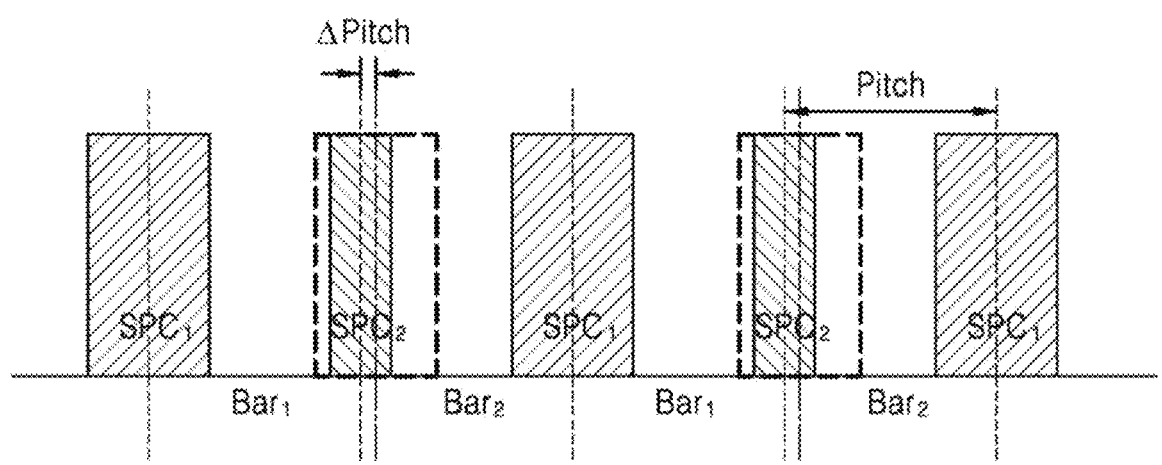

FIGS. 10A and 10B illustrate a relationship between a pitch walk and a change in a space (bar) due to a change in the width of a line (spacer) when an L/S pattern is formed by DPT. In FIGS. 10A and 10B, SPC corresponds to a line, and Bar corresponds to a space.

Referring to FIG. 10A, in an embodiment, FIG. 10A shows a case in which, although a pitch walk ΔPitch occurs, there is no change in the width of the SPC. In this case, a pitch walk PWI is calculated as follows.

$$PWI = ABS(Pitch_n - Pitch_{n+1})/2$$

$$Pitch_n = SPC_n/2 + SPC_{n+1}/2 + Bar_n$$

If $SPC_n \equiv SPC_{n+1}$ then $2 \times PWI =$ $$ABS(Pitch_n - Pitch_{n+1}) = ABS(SPC_n + Bar_n - SPC_{n+1} - Bar_{n+1}) =$$

$$ABS(Bar_n - Bar_{n+1})$$

$$\therefore PWI = \Delta Bar/2$$

Here, ABS is an absolute value symbol.

Referring to FIG. 10B, in an embodiment, FIG. 10B shows a case in which a pitch walk ΔPitch occurs and there is a change in the width of the SPC. In this case, the pitch walk PWI is calculated as follows.

If $SPC_n \neq SPC_{n+1}$ then $2 \times PWI = ABS(Pitch_n - Pitch_{n+1}) =$ $$ABS(SPC_n/2 + SPC_{n+1}/2 + Bar_n - SPC_{n+1}/2 -$$

$$SPC_{n+2}/2 - Bar_{n+1}) =$$

$$ABS(Bar_n - Bar_{n+1} +$$

$$SPC_n/2 - SPC_{n+2}/2) = ABC(\Delta Bar + SPC_n/2 - SPC_{n+2}/2)$$

But $SPC_n = SPC_{n+2}$ $$\therefore PWI = \Delta Bar/2$$

In conclusion, when an L/S pattern is formed by DPT, regardless of a change in the width of a line that corresponds to a spacer, a pitch walk appears as ½ of the change in the width of a space that corresponds to a bar.

Figure 11A:
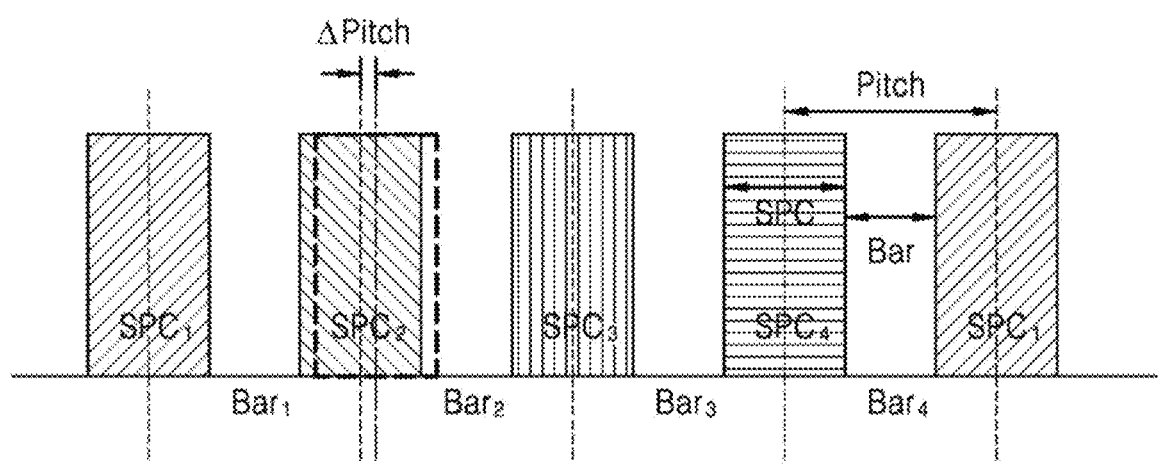
FIGS. 11A and 11B illustrate a relationship between a pitch walk and a change in a space (bar) according to a change in the width of a line (spacer) when an L/S pattern is formed through QPT.
Figure 11B:
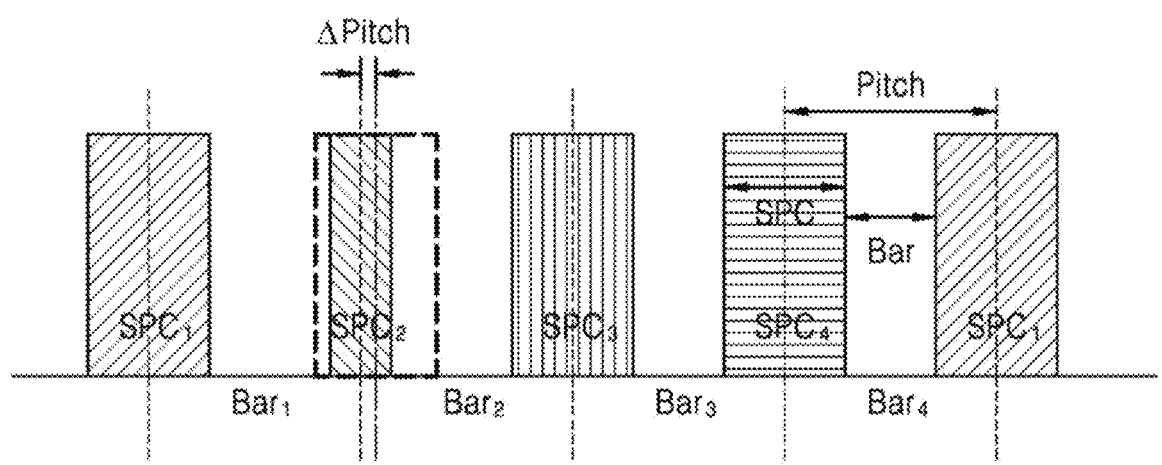

FIGS. 11A and 11B illustrate a relationship between a pitch walk and a change in a space (bar) due to a change in the width of a line (spacer) when an L/S pattern is formed by the QPT. In FIGS. 11A and 11B, SPC corresponds to a line, and Bar corresponds to a space.

Referring to FIG. 11A, in an embodiment, FIG. 11A shows a case in which, although a pitch walk ΔPitch occurs, there is no change in the width of the SPC. In this case, the pitch walk PWI is calculated as follows.

$$PWI = ABS(Pitch_n - Pitch_{n+1})/2$$

$$Pitch_n = SPC_n/2 + SPC_{n+1}/2 + Bar_n$$

If $SPC_n \equiv SPC_{n+1}$ then $2 \times PWI =$ $$ABS(Pitch_n - Pitch_{n+1}) = ABS(SPC_n + Bar_n - SPC_{n+1} - Bar_{n+1}) =$$

$$ABS(Bar_n - Bar_{n+1})$$

$$\therefore PWI = \Delta Bar/2$$

Referring to FIG. 11B, in an embodiment, FIG. 11B shows a case in which a pitch walk ΔPitch occurs and there is a change in the width of the SPC. In this case, the pitch walk PWI is calculated as follows.

If $SPC_n \neq SPC_{n+1}$ then $2 \times PWI = ABS(Pitch_n - Pitch_{n+1}) =$ $$ABS(SPC_n/2 + SPC_{n+1}/2 + Bar_n - SPC_{n+1}/2 - SPC_{n+2}/2 - Bar_{n+1}) =$$

$$ABC(\Delta Bar + SPC_n/2 - SPC_{n+2}/2)$$

But $SPC_n \neq SPC_{n+2}$ $$\therefore PW \neq \Delta Bar/2$$

In conclusion, when an L/S pattern is formed by QPT and there is no change in the width of a line that corresponds to a spacer, a pitch walk appears as ½ of a change in the width of a space that corresponds to a bar. However, when there is a change in the width of the line, there is a mismatch between the pitch walk and the change in the width of the space. Therefore, to determine a correct pitch walk, all CDs within a pitch of a layout pattern are measured. As described above, in FIG. 9A or FIG. 9B, in a pitch walk inspection method of a comparative example, by measuring and comparing only some CDs within the pitch of the layout pattern, an error can occur in the pitch walk.

Figure 12:
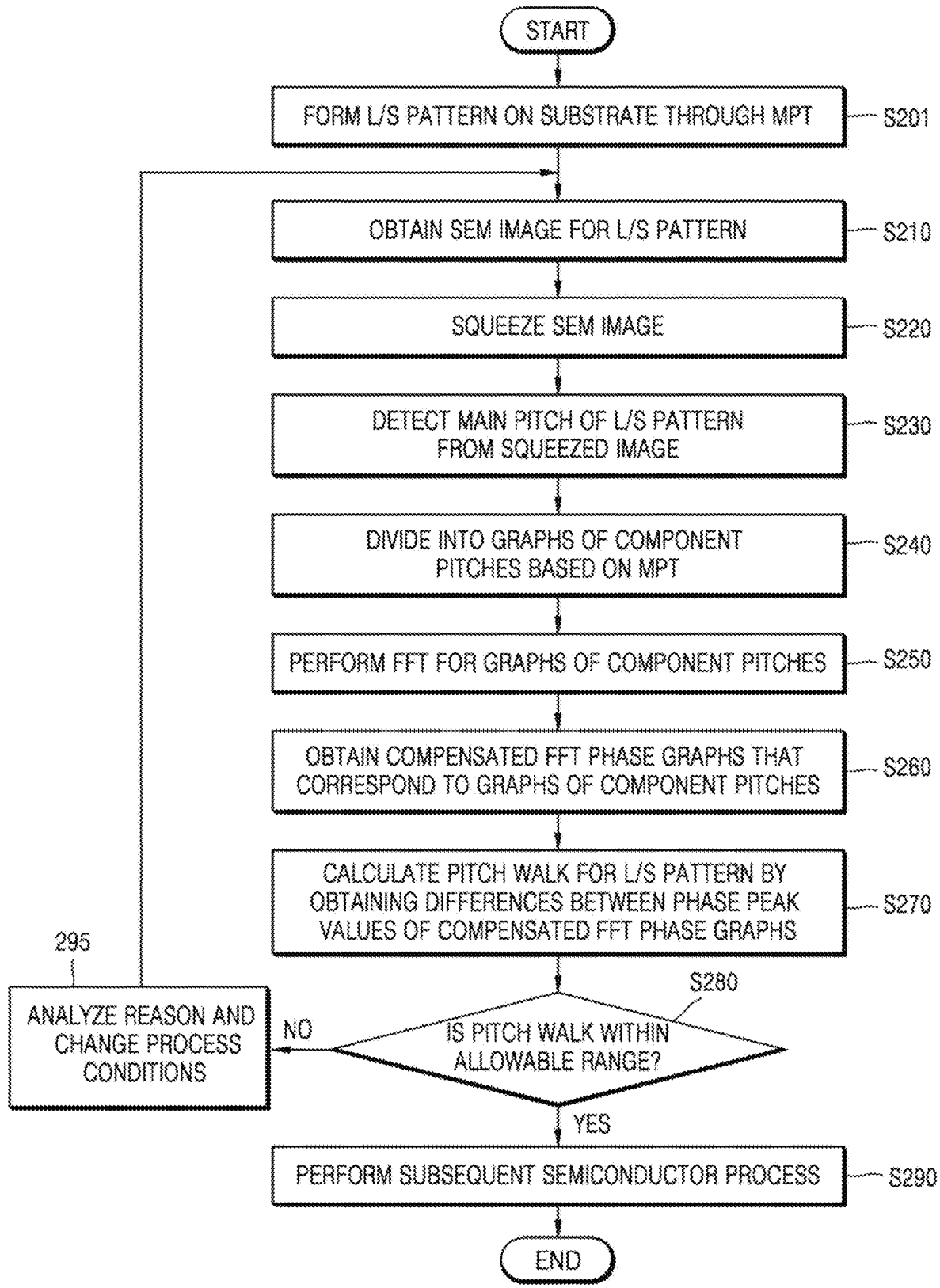
FIG. 12 is a flowchart of a method of manufacturing a semiconductor device that includes a pitch walk inspection method according to an embodiment of the inventive concept.

FIG. 12 is a flowchart of a method of manufacturing a semiconductor device that includes a pitch walk inspection method according to an embodiment of the inventive concept. Descriptions already given above with reference to FIGS. 1 to 11B are summarized or omitted.

Referring to FIG. 12, in a method of manufacturing a semiconductor device that includes a pitch walk inspection method of an embodiment, hereinafter simply referred to as a 'method of manufacturing a semiconductor device', an L/S pattern is formed on a substrate through MPT (operation S201). The MPT may be DPT, TPT, or QPT. In addition, the L/S pattern is formed on a material layer on the substrate. However, according to some embodiments, the L/S pattern is formed on the substrate.

After the L/S pattern is formed, operation S210 that obtains an SEM image to operation S270 that calculates a pitch walk for the L/S pattern are sequentially performed. Operation S210 that obtains an SEM image to operation S270 that calculates a pitch walk for the L/S pattern respectively correspond to operation S110 that obtains an SEM image to operation S170 that calculates a pitch walk for the L/S pattern of FIG. 1 as described above.

Thereafter, whether a calculated pitch walk is within an allowable range is determined (operation S280). The allowable range is set differently depending on the type of semiconductor device. In addition, the allowable range is set differently depending on the type of MPT. According to some embodiments, even for the same semiconductor device or the same type of MPT, the allowable range is set differently according to the location and the function of an L/S pattern.

When the pitch walk is within the allowable range (Yes), a subsequent semiconductor process is performed (operation S290). The subsequent semiconductor processes include various processes. For example, the subsequent semiconductor processes include one or more of a deposition process, an etching process, an ion process, a cleaning process, etc. When the L/S pattern is formed through MPT in a subsequent semiconductor process, the pitch walk inspection method of an embodiment can be used again.

The subsequent semiconductor process also include a wafer level semiconductor device testing process. Furthermore, the subsequent semiconductor process of a semiconductor device includes a process for dividing a wafer into semiconductor chips and a process of packaging the semiconductor chips. A packaging process is a process in which semiconductor chips are mounted on a PCB and sealed with a sealing material and further includes forming a stack package by stacking a plurality of semiconductors on a PCB to a plurality of layers or forming a package on package (POP) structure by stacking another stack package on a stack package. A semiconductor device or a semiconductor package is completed through a process of packaging semiconductor chips.

When a pitch walk is out of the allowable range (No), a reason thereof is analyzed and conditions of a corresponding MPT process are changed (operation S295). Thereafter, the method proceeds back to operation 5201 that forms an L/S pattern again.

While embodiments of the inventive concept have been particularly shown and described with reference to figures thereof, it will be understood that various changes in form and details may be made therein without departing from the spirit and scope of the following claims.

What is claimed is:

1. A scanning electron microscope (SEM) image-based pitch walk inspection method, comprising:
    obtaining an SEM image for a line and space (L/S) pattern formed by multi-patterning technology (MPT), wherein the L/S pattern includes a plurality of lines and spaces that are alternately arranged;
    detecting a main pitch of the L/S pattern in the SEM image;
    dividing a graph of the main pitch into graphs of component pitches, based on the MPT;
    performing a Fast Fourier Transform (FFT) on each graph of the component pitches;
    multiplying a phase graph and an intensity graph of the FFT of each graph of the component pitches with each other and obtaining compensated FFT phase graphs that respectively correspond to the graphs of the component pitches;
    calculating a pitch walk of the L/S pattern by obtaining differences between phase peak values of the compensated FFT phase graphs; and
    determining whether the pitch walk is within an allowable range so as to determine whether to change a condition of a MPT process or to perform a subsequent semiconductor manufacturing process.

2. The SEM image-based pitch walk inspection method of claim 1, further comprising: before detecting the main pitch, performing image squeezing that reconstructs an image by averaging an intensity for each line and each space of the L/S pattern in the SEM image.

3. The SEM image-based pitch walk inspection method of claim 1, wherein the MPT includes a double patterning technology (DPT),
    the graphs of the component pitches include two graphs, and
    the component pitch is defined as a pitch between alternately arranged lines and is twice the main pitch.

4. The SEM image-based pitch walk inspection method of claim 3, wherein the pitch walk is equal to ½ of a change in a width of the space.

5. The SEM image-based pitch walk inspection method of claim 1, wherein the MPT includes a quadruple patterning technology (QPT),
    the graphs of the component pitches include four graphs, and
    the component pitch is defined as a pitch between every fourth line and is four times the main pitch.

6. The SEM image-based pitch walk inspection method of claim 5, wherein, when widths of two adjacent lines are the same, the pitch walk is equal to ½ of the change in a width of the space, and
    when the widths of the two adjacent lines differ from each other, the pitch walk is not equal to ½ of the change in the width of the space.

7. The SEM image-based pitch walk inspection method of claim 1, wherein the phase peak values include one or more differences thereof, according to the MPT, and
    when a number of differences is greater than one, the pitch walk corresponds to a largest difference.

8. The SEM image-based pitch walk inspection method of claim 1, wherein, letting MP represent the MPT, PIH represent the main pitch, and PWI represent the pitch walk, equation (1) below is established, $$(PIH+PWI)/MP \times PIH = (2\pi/MP + \theta)/2\pi \qquad \text{Equation (1)}$$

wherein MP equals 2 when the MPT is a double patterning technology (DPT), MP equals 3 when the MPT is a triple patterning technology (TPT), and MP equals 4 when the MPT is a quadruple patterning technology (QPT), and
MP×PIH corresponds to a phase of $2\pi$ and $\theta$ corresponds to a phase of the pitch walk.

9. The SEM image-based pitch walk inspection method of claim 8, wherein, based on Equation (1), PWI is represented by $(\theta \times PIH \times MP)/2\pi$,
    in the SEM image, the PIH is obtained in pixels and the PWI is calculated in pixels, and
    PWI is calculated as a distance by converting pixels into a distance.

10. The SEM image-based pitch walk inspection method of claim 1, wherein, detecting the main pitch includes:
    expressing the SEM image as a graph of intensity as a function of positions,
    in the intensity graph, letting a first peak position be referred to as $Peak_0$ and an n+1-th peak position be referred to as $Peak_n$, and
    calculating the main pitch by $(Peak_n - Peak_0)/n$.

11. A scanning electron microscope (SEM) image-based pitch walk inspection method, comprising:
    obtaining an SEM image for a line and space (L/S) pattern formed by a quadruple patterning technology (QPT), wherein the L/S pattern includes a plurality of lines and spaces that are alternately arranged;
    detecting a main pitch of the L/S pattern in the SEM image;
    dividing a graph of the main pitch into four graphs of component pitches;

performing a Fast Fourier Transform (FFT) on each of the four graphs of the component pitches;

multiplying a phase graph and an intensity graph of the FFT of each of the four graphs of the component pitches with each other and obtaining four compensated FFT phase graphs that respectively correspond to the four graphs of the component pitches;

calculating a pitch walk for the L/S pattern by obtaining a largest difference of differences between phase peak values of the four compensated FFT phase graphs; and determining whether the pitch walk is within an allowable range so as to determine whether to change a condition of a QPT process or to perform a subsequent semiconductor manufacturing process.

12. The SEM image-based pitch walk inspection method of claim 11, wherein, letting PIH represent the main pitch and PWI represent the pitch walk, equation (1) below is established, $$(PIH+PWI)/MP \times PIH = (2\pi/MP+\theta)/2\pi \qquad \text{Equation (1)}$$

wherein 4×PIH corresponds to a phase of $2\pi$ and $\theta$ corresponds to a phase of the pitch walk.

13. A method of manufacturing a semiconductor device, the method comprising:

forming a line and space (L/S) pattern on a substrate by a multi-patterning technology (MPT), wherein L/S pattern includes a plurality of lines and spaces that are alternately arranged;

obtaining a scanning electron microscope (SEM) image for the L/S pattern;

detecting a main pitch of the L/S pattern in the SEM image;

dividing a graph of the main pitch into graphs of component pitches, based on the MPT;

performing a Fast Fourier Transform (FFT) on each graph of the component pitches;

multiplying a phase graph and an intensity graph of the FFT of each of the graphs of the component pitches with each other and obtaining compensated FFT phase graphs that respectively correspond to the graphs of the component pitches;

calculating a pitch walk of the L/S pattern by obtaining differences between phase peak values of the compensated FFT phase graphs;

determining whether the pitch walk is within an allowable range; and when the pitch walk is within the allowable range, performing a subsequent semiconductor process.

14. The method of claim 13, further comprising: before detecting the main pitch, performing image squeezing that reconstructs an image by averaging an intensity for each line and each space of the L/S pattern in the SEM image.

15. The method of claim 13, wherein the MPT includes a double patterning technology (DPT), the graphs of the component pitches include two graphs, the component pitch is defined as a pitch between alternately arranged lines and is twice the main pitch, and the pitch walk is equal to ½ of a change in a width of the space.

16. The method of claim 13, wherein the MPT includes a quadruple patterning technology (QPT), the graphs of the component pitches include four graphs, the component pitch is defined as a pitch between every fourth line and is four times the main pitch, when widths of two adjacent lines are the same, the pitch walk is equal to ½ of a change in a width of the space, and when the widths of the two adjacent lines differ from each other, the pitch walk is not equal to ½ of the change in the width of the space.

17. The method of claim 13, wherein the differences between phase peak values include one or more differences between the phase peak values according to the MPT, and when a number of differences is two or greater, the pitch walk corresponds to a largest difference.

18. The method of claim 13, wherein, letting MP represent the MPT, PIH represent the main pitch, and PWI represent the pitch walk, equation (1) below is established, $$(PIH+PWI)/MP \times PIH = (2\pi/MP+\theta)/2\pi \qquad \text{Equation (1)}$$

wherein MP equals 2 when the MPT is a double patterning technology (DPT), MP equals 3 when the MPT is a triple patterning technology (TPT), and MP equals 4 when the MPT is a quadruple patterning technology (QPT), wherein MP×PIH corresponds to a phase of $2\pi$ and $\theta$ corresponds to a phase of the pitch walk.

19. The method of claim 18, wherein, based on equation (1), PWI is represented by $(\theta \times PIH \times MP)/2\pi$, in the SEM image, the PIH is obtained in pixels and the PWI is calculated in pixels, and PWI is calculated as a distance by converting pixels into a distance.

20. The method of claim 13, wherein, detecting the main pitch includes: expressing the SEM image as a graph of intensities as a function of positions, and the main pitch and an average CD are calculated based on the intensity graph.

* * * * *